US007756598B2

(12) United States Patent
Annamaneni et al.

(10) Patent No.: US 7,756,598 B2
(45) Date of Patent: *Jul. 13, 2010

(54) SYSTEM AND METHOD FOR AUTOMATING INTEGRATION OF SEMICONDUCTOR WORK IN PROCESS UPDATES

(75) Inventors: Sabhapathi Naidu Annamaneni, San Jose, CA (US); Sarangkumar Sharadchandra Bhavsar, Sunnyvale, CA (US)

(73) Assignee: eSilicon Corporation, Sunnyvale, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 12/346,651

(22) Filed: Dec. 30, 2008

(65) Prior Publication Data

US 2009/0106066 A1  Apr. 23, 2009

Related U.S. Application Data

(62) Division of application No. 10/619,738, filed on Jul. 14, 2003, now Pat. No. 7,474,933.

(51) Int. Cl.
*G06F 19/00* (2006.01)

(52) U.S. Cl. .................... 700/108; 700/100; 700/115; 700/121

(58) Field of Classification Search ........... 700/95–100, 700/108, 115, 121
See application file for complete search history.

(56) References Cited

U.S. PATENT DOCUMENTS

| 5,889,674 A * | 3/1999 | Burdick et al. ............... 700/121 |
| 6,684,121 B1 * | 1/2004 | Lu et al. ..................... 700/108 |
| 2002/0188682 A1 * | 12/2002 | Jaln et al. .................... 709/205 |
| 2003/0236718 A1 * | 12/2003 | Yang et al. .................... 705/28 |

OTHER PUBLICATIONS

"Oracle E-Business Suite High-Tech Semiconductor Industry Solutions, Achieving Excellence in Manufacturing Execution and Customer Response Through Oracle Shop Floor Management", An Oracle White Paper, Feb. 2003.*

* cited by examiner

*Primary Examiner*—Paul L Rodriguez
*Assistant Examiner*—Carlos Ortiz Rodriguez
(74) *Attorney, Agent, or Firm*—Fenwick & West LLP

(57) ABSTRACT

WIP status updates, as received from semiconductor manufacturing suppliers, is converted to transactions. In one approach, supply chain events, for example lot splits, lot merges, and lot scrap, are identified based on previous lot statuses and current lot statuses from the WIP status update. Identified events are interpreted as transactions, which can be used to interface with a transactional system such as an ERP system.

28 Claims, 15 Drawing Sheets

SYSTEM AND METHOD FOR AUTOMATING INTEGRATION OF SEMICONDUCTOR WORK IN PROCESS UPDATES

CROSS-REFERENCE TO RELATED APPLICATION(S)

This application is a division of U.S. patent application Ser. No. 10/619,738, "System and Method for Automating Integration of Semiconductor Work in Process Updates," filed Jul. 14, 2003. The subject matter of the foregoing is incorporated herein by reference in its entirety.

BACKGROUND OF THE INVENTION

1. Field of the Invention

The present invention relates generally to manufacturing information systems. More specifically, it relates to converting semiconductor manufacturing Work in Process status updates into transactions that may be processed by transactional systems, including but not limited to an Enterprise Resource Planning system.

2. Description of the Related Art

The semiconductor industry has been transformed over the last 20 years, as it has transitioned from a highly vertically integrated model, with a few dominant Integrated Device Manufacturers, to a dis-integrated environment comprised of hundreds of highly specialized suppliers and fabless semiconductor companies. In this dis-integrated environment, most fabless semiconductor companies currently face significant challenges with respect to the exchange and integration of information with the suppliers in their supply chains.

As semiconductor manufacturing processes have become more complex, a host of specialized supplier companies has arisen, including pure-play foundries for wafer fabrication, assembly houses for packaging, and test facilities for wafer sorting and final verification. A typical customer (e.g., a fabless semiconductor company) will focus on its core competencies of product development, and contract with multiple suppliers for various manufacturing services, including wafer fabrication, assembly, and test.

As the outsourcing of key manufacturing operations has become commonplace, semiconductor supply chains have evolved into complex networks of suppliers and customers. For example, a customer may outsource its manufacturing operations to multiple suppliers: the wafer fabrication to a pure-play foundry; wafer sort to a second supplier; assembly and packaging to a third supplier; and final test to a fourth supplier. Nevertheless, the customer typically desires visibility into the supply chain in order to track the progress of its products through the supply chain.

On the other hand, participants in the semiconductor supply chain may have one or more information systems. These may include manufacturing execution systems (MES), enterprise resource planning (ERP) systems, and supply chain management (SCM) systems. As there are a plethora of MES, ERP, and SCM vendors, product offerings, and system configurations to choose from, each participant can have a unique combination of information systems and software, tailored to that company's unique business processes and needs. The different information systems typically also make use of different data formats and communications mechanisms for the potential exchange of information. There are not, as yet, any widely adopted standards.

The combination of disparate systems and the lack of widely adopted standards presents significant technical challenges for companies and customers that want to integrate information from these disparate systems, as this typically requires a series of custom integration projects to link the systems in a customer's supply chain. Such integration projects are lengthy and expensive, and can require significant commitments from each supply chain member. As few organizations have the budget, technical personnel, and leverage to negotiate these commitments with suppliers, the present environment in the semiconductor industry has evolved into a dis-integrated model in which an increasing number of information systems are not linked. In this situation, companies that outsource their manufacturing operations to dis-integrated suppliers have very limited visibility and control of the semiconductor manufacturing process. They also face significant barriers in addressing and overcoming these deficiencies. This places smaller companies that outsource at a further disadvantage, as they are less able to afford the costs of integration with their suppliers.

One important problem that customers in this environment face is the need to track and manage the flow of parts throughout the entire manufacturing process. Due to the long manufacturing cycles of semiconductors, customers generally desire regular updates of "work in process" (WIP) for their orders. This helps detect problems early in the manufacturing process, enabling customers to avoid "surprises" and to respond quickly when problems arise. To gain an integrated view of the manufacturing process, a customer would have to integrate WIP updates from the systems of multiple suppliers, each of which will typically have different types of information systems that supply WIP updates in different data formats and employ different communications mechanisms. The task of manually integrating large volumes of different types of WIP updates from multiple suppliers on a regular basis is too time-consuming, complex, and costly to be practical. As the number of products and suppliers in the supply chain increases, the amount of work, personnel required, and associated cost also continues to increase. Thus, there is a need to automate the integration of WIP updates from multiple suppliers with disparate systems.

Automating the integration process requires overcoming a number of technical challenges regarding data formats, communication methods, and content of WIP updates. WIP updates can be provided in a wide variety of data formats, including CSV (comma separated value), TSV (tab separated value), ASCII fixed-format text, Excel files, and XML. Multiple communications mechanisms are currently in widespread use as well, including FTP, HTTP, email transport, and EDI. The content of WIP updates includes updates for one or more manufacturing lots. Each manufacturing lot consists of a quantity of wafers or die that are grouped and processed together by a supplier. These lots may split, merge, lose quantity, and so forth; and, as previously mentioned, suppliers typically provide WIP updates to customers on a periodic basis.

WIP updates can be broadly divided into two types: "status" and transactional. WIP status updates typically include a set of records, one for each lot in the supplier's system. These records represent the current status, or "state," of each lot at a specified point in time. WIP transactional updates provide a chronological series of transactions, which represent the "changes in state" that have affected lots in the supplier's system.

One problem with status updates is that they do not provide any direct information regarding events, such as split, merge, and scrap. The data provided only reports the current status of a lot at the time the status was taken. In other words, a WIP status update provides no notification regarding what has actually changed: whether the lot has split, merged with another lot, or lost quantity. Transactional updates, on the other hand, explicitly describe events, as they capture the "state changes" effected by events. The transactional method creates a series of records that describe the events that affect a given lot. This creates transactions each time a lot is split, merged, or scrapped, for example.

The "status" approach currently is the method most widely used throughout the industry, as it is simpler and cheaper for suppliers to implement. A supplier can simply extract a set of current records from its existing MES, ERP, or SCM system. Conversely, the transactional method is rarely provided by suppliers, because of the additional complexity and expense for suppliers. It requires the ability to maintain a history of transactions and extract records from this history—a feature not typically provided by the vendors of MES, ERP, and SCM systems.

The fact that the vast majority of suppliers only provide WIP status updates poses a significant challenge in the integration of WIP updates. Virtually all modern information systems for tracking lots are built upon a transaction processing model. As such, integrating a company's own lot tracking system with disparate supplier systems typically requires access to either transactional updates or some access to event information from which transactions can be derived.

Thus, a typical customer finds itself in a dilemma created by the fact that the semiconductor supply chain environment consists largely of multiple disparate systems that generate WIP status updates in a wide variety of data formats using a wide variety of communication mechanisms. There is no ready solution that provides a simple, straightforward method for automatically integrating WIP status updates throughout the manufacturing process. On the one hand, the status updates that are readily available from suppliers, albeit in different formats, do not include the information about lot events necessary to create transactions for the customer's system. On the other hand, it is difficult to gain automated access to WIP transactional updates from suppliers.

Numerous methods have been advanced to address some of the afore-mentioned needs, including certain WIP tracking systems, WIP data collection services, and a variety of collaborative solutions. However, existing WIP tracking systems typically target shop floor automation and interface directly with shop floor equipment. These systems do not currently provide features to integrate data from multiple suppliers without expensive custom integration, and do not provide WIP information in a transactional form that can be integrated into a Transactional Enterprise System.

WIP data collection services provide services to retrieve data from multiple suppliers and deliver it to an end customer. Such systems may offer custom integration services to standardize or convert the data from multiple sources into a common format to be specified by the end customer. However, the WIP data collection services currently available do not convert status information to a transactional form, and are typically as expensive as custom integration efforts.

A variety of collaborative solutions have been put forth, including exchanges, collaborative integration methods, and proposed industry standards. The exchange model requires that participants within a given supply chain join the exchange, and either link their information systems to the exchange or adopt and install exchange system software to run their business processes. Collaborative integration methods provide common integration components to link the various members of a supply chain together. These require all members of a given supply chain to adopt and install these common integration components in order to provide interoperability between the various systems.

Additionally, a number of industry standards have been proposed for exchanging and integrating WIP updates. One of these industry standards is RosettaNet, which has proposed "partner interface processes" (PIPs) for WIP updates. However, the RosettaNet implementation is actually a variant of the above-mentioned "collaboration" systems. It requires the adoption of software components on the part of each supply chain member, and involves complex, lengthy, and expensive integration projects.

Despite these efforts, there is currently no single solution, system or standard that has attracted widespread acceptance. The vast majority of suppliers in the semiconductor industry continue to provide WIP updates primarily as status updates, in a variety of different formats using multiple communication mechanisms. Integrating WIP updates into customer information systems, in the present environment, continues to be a complex, difficult, and expensive proposition.

Thus there is a need for an integration system and method, which can overcome some or all of the above-identified problems.

SUMMARY OF THE INVENTION

The present invention overcomes the various limitations of the prior art by identifying transactions (for example, lot updates, lot splits, lot merges, lot scraps) from Work in Process (WIP) status updates received from suppliers in the semiconductor supply chain. These transactions can be processed by a Transactional Enterprise System, such as an Enterprise Resource Planning (ERP) system, thus facilitating automated processing of supplier WIP status updates.

In one approach, WIP status updates for a semiconductor product are received from at least one supplier in the supply chain for the semiconductor product. The WIP status updates are converted to a generalized form. Preferably, the generalized form is used for all WIP status updates, thus establishing a common baseline for comparison. In one implementation, the generalized form also divides the semiconductor manufacturing processing into a predefined set of logical operations that have coarser granularity than the processing steps used in the supplier's WIP status update. The WIP status updates in the generalized form are compared to a previous WIP status for the semiconductor product (as may be maintained in a database). Transactions are identified based on the comparison.

In one aspect, the WIP status updates are expressed in lots, with each lot containing a quantity of the semiconductor product. Transaction identification occurs on a lot basis, for example based on a change in the quantity of semiconductor product in a lot. In one approach, lots from the WIP status update are grouped with lots from the previous WIP status (e.g., by customer product ID, lot ID, etc.), and transactions are identified within the groupings. Within each grouping, lots can be classified according to a change in the quantity of the lot from the previous WIP status to the current WIP status (i.e., the WIP status update). For example, a lot may be a potential split-child lot if it appears in the WIP status update but not in the previous WIP status. Possible valid combinations of lots are identified according to their classifications (e.g., a potential split-child lot may possibly be combined with a potential split-parent lot). Transactions are identified by evaluating the possible valid combinations of lots.

In a specific implementation, transactions are identified from WIP status updates in two steps. First, supply chain events are identified based on a comparison of the WIP status updates in the generalized form with the previous WIP status for the semiconductor product. Then, the supply chain events are interpreted as transactions. Supply chain events that are interpreted as more than one transaction may result in the creation of transient WIP statuses.

In an example implementation, a system includes an adapter, a transaction identifier (which includes an event identifier, an event interpreter, and an interpretation rules database), and a WIP tracking database. The adapter(s) receive the WIP status updates and convert them to the generalized form. The event identifier identifies supply chain events based on comparisons of the WIP status updates and previous WIP status, as retrieved from the WIP tracking database. The event interpreter converts the supply chain events to transactions, according to rules supplied by the interpretation rules database. The system may further include a transaction processor, for processing the transactions to update a transactional enterprise system. The WIP tracking database can be updated by a synchronizer, based on the updated transactional enterprise system.

Other aspects of the invention include other methods, devices and systems corresponding to the approaches described above.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

Figure 1A:
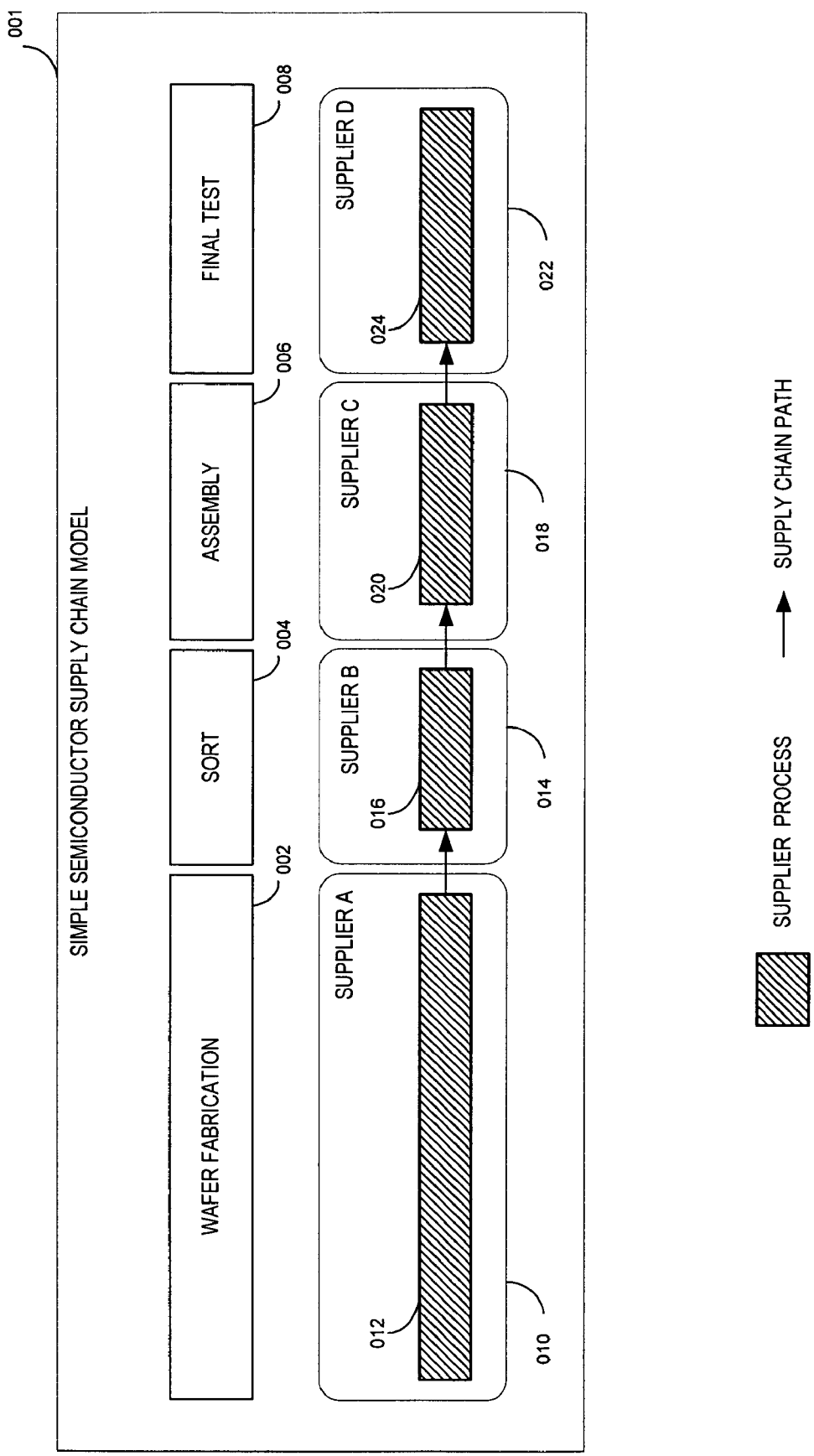
FIG. 1A is a schematic diagram that illustrates a model of a simple semiconductor manufacturing supply chain.

FIG. 1A illustrates one model 001 of a simple semiconductor supply chain. Semiconductor manufacturing can be modeled as four major processes, which occur in the following order: Wafer Fabrication 002, Sort (e.g., circuit probing) 004, Assembly 006, and Final Test 008. In some cases, the supply chain may not include a Sort 004 process, for example if the Wafer Fabrication Process 012 has stabilized with high yields, as is often the case with mature products. This model also involves a plurality of semiconductor manufacturers and service providers, which are referred to generally as suppliers: specifically, Supplier A 010, Supplier B 014, Supplier C 018, and Supplier D 022. In FIG. 1A, the boxes 012, 016, 020 and 024 represent the actual processes implemented by these suppliers.

The example model 001 shown in FIG. 1A is a linear model in which each supplier implements only one process and transfers the resulting material to the next supplier in the chain to continue with the next process. The arrows between the supplier processes indicate dependencies in the semiconductor manufacturing process. Thus, process 016 performed by Supplier B 014 is dependent upon completion of process 012 performed by Supplier A 010. Accordingly, Supplier B 014 may be referred to as being a "downstream" supplier of Supplier A 010. Conversely, Supplier A 010 is an "upstream" supplier of Supplier B 014. In the same manner, Supplier B 014 is an upstream supplier of both Supplier C 018 and Supplier D 022.

The invention applies equally to other models and other supply chains, including those in which one supplier transfers material to multiple downstream suppliers, those in which one supplier receives material from multiple upstream suppliers, those in which one supplier performs more than one process, and those in which a supplier offers multiple configurations of process services. As examples, a wafer foundry may transfer processed wafers to multiple sort suppliers, a final test supplier may receive material from multiple assembly suppliers, a single supplier may perform both assembly and final test processes consecutively, and one supplier may offer three configurations of services consisting of assembly only, final test only, and assembly and final test. In addition, the one to one correspondence between suppliers and processes shown in FIG. 1A is not required. Generally speaking, suppliers may perform any subset of steps within the semiconductor supply chain and there may be any number of suppliers (including just one). The supply chain may also extend beyond just manufacturing, for example to also include design activities.

Figure 1B:
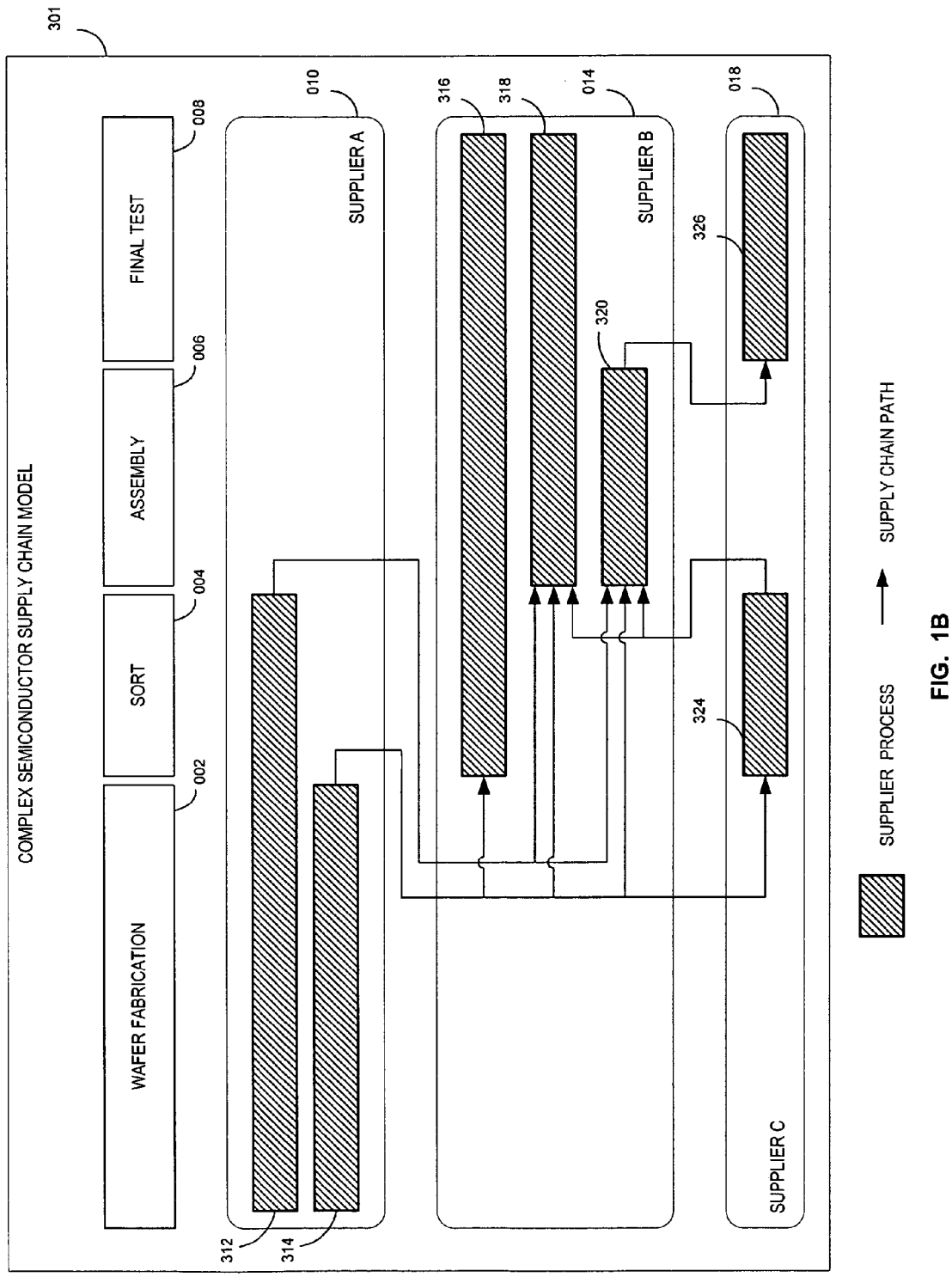
FIG. 1B is a schematic diagram that illustrates a model of a more complex semiconductor manufacturing supply chain.

FIG. 1B illustrates a model 301 for a more complex semiconductor supply chain. Suppliers in this example provide services that include various combinations of processes. Supplier A 010 provides service configurations of both Wafer Fabrication 002 and Wafer Fabrication 002 with Sort 004. Supplier B 014 provides different configurations of services for Sort 004, Assembly 006, and Final Test 008. Supplier C 018 provides both Sort 004 and Final Test 008 services. The boxes 312, 314, 316, 318, 320, 324, and 326 represent the various configurations of supplier services that are available for manufacturing semiconductor product. A manufacturing flow for a specific lot of product typically involves the transfer of material from one supplier service to another for further processing. This is shown in FIG. 1B by the arrows that connect the services from one supplier to another supplier in the supply chain model 301. In FIG. 1B, the arrows show the different possible paths that lots can take through the different suppliers.

The manufacturing flows for different products vary depending upon numerous factors, including supplier costs, supplier capacities, and the phase of the product being manufactured. Products typically progress through two distinct phases, an initial engineering phase and a volume production phase, which may require different process flows to different suppliers. For each product, an appropriate manufacturing flow is created from the available supplier service configurations, as illustrated in the following examples of flows for an engineering product and a volume product.

During the early part of a product's engineering phase, a relatively small number of initial prototypes are typically created to verify the product's functionality and manufacturability. In this period, sort test programs may be still under development, and it is possible that the process for Sort 004 will be skipped. The process flow for this engineering material will thus consist of Wafer Fabrication 002, followed by Assembly 006 and Final Test 008. For example, the wafers may be created by Supplier A 010 using process 314 for Wafer Fabrication 002. The unsorted wafers may be transferred to Supplier B 014, which uses process 320 for Assembly 006. The assembled and packaged parts may then be sent to a specialty test Supplier C 018, which uses process 326 for Final Test 008 of the prototype parts.

Once a product has been qualified, it typically enters a volume production phase. A complete process flow is typically used, consisting of Wafer Fabrication 002, Sort 004, Assembly 006, and Final Test 008. For improved efficiency and lower costs, the manufacturing flow is often streamlined by having multiple consecutive processes executed by the same supplier. For example, the production wafers may be created by Supplier A 010 using process 312 for Wafer Fabrication 002 and Sort 004. The sorted wafers may then be transferred to Supplier B 014, which uses process 318 for Assembly 006 and Final Test 008 of the production parts. Note that lots may not always remain together for the entire supply chain. Lots can be split, merged, and otherwise altered for various reasons, as will be further described below.

Figure 2:
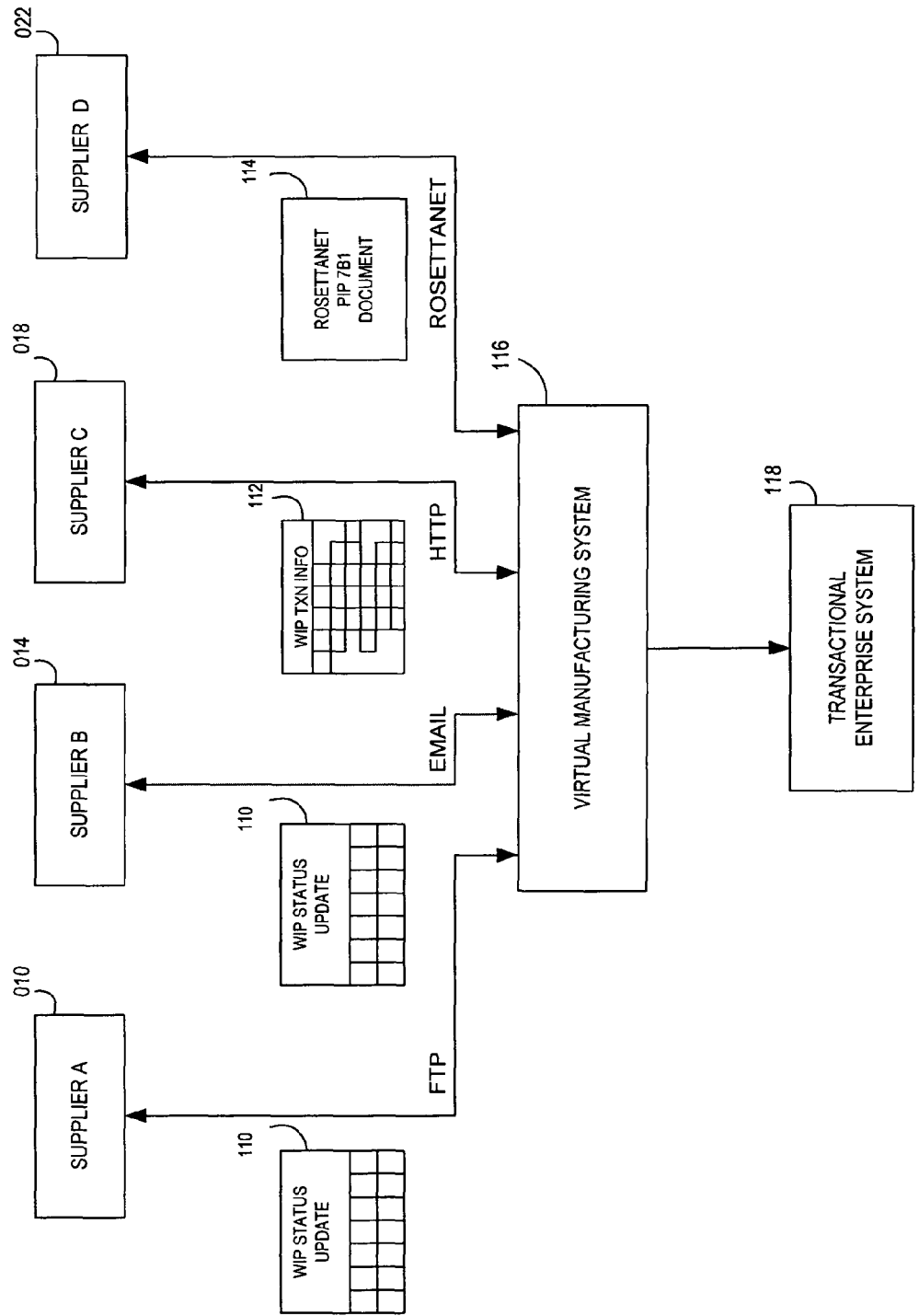
FIG. 2 is a block diagram that illustrates a virtual manufacturing system interfacing with various suppliers' systems and a transactional enterprise system.

FIG. 2 illustrates an example system that integrates various suppliers' WIP updates via a Virtual Manufacturing System (VMS) 116. In this example, supplier A 010 is a wafer fabrication supplier, supplying wafer fabrication WIP Status Update 110 in either text or CSV format via an FTP communications mechanism. Supplier B 014 is a wafer sort supplier, providing the wafer sort WIP Status Update 110 in either text or CSV format via email. Supplier C 018 is an assembly supplier, supplying assembly WIP Transactional Update 112 via an HTTP communication mechanism. Supplier D 022 is a final test supplier, supplying test WIP Update using the RosettaNet PIP 7B1 114.

The VMS 116 is an enterprise WIP integration system in this example. The VMS 116 processes the different WIP updates from the disparate supplier systems, as delivered through various communications mechanisms, and provides a set of transactions to be integrated into one or more instances of a Transactional Enterprise System 118. In one implementation, the Transactional Enterprise System 118 is an Oracle ERP system.

Figure 3:
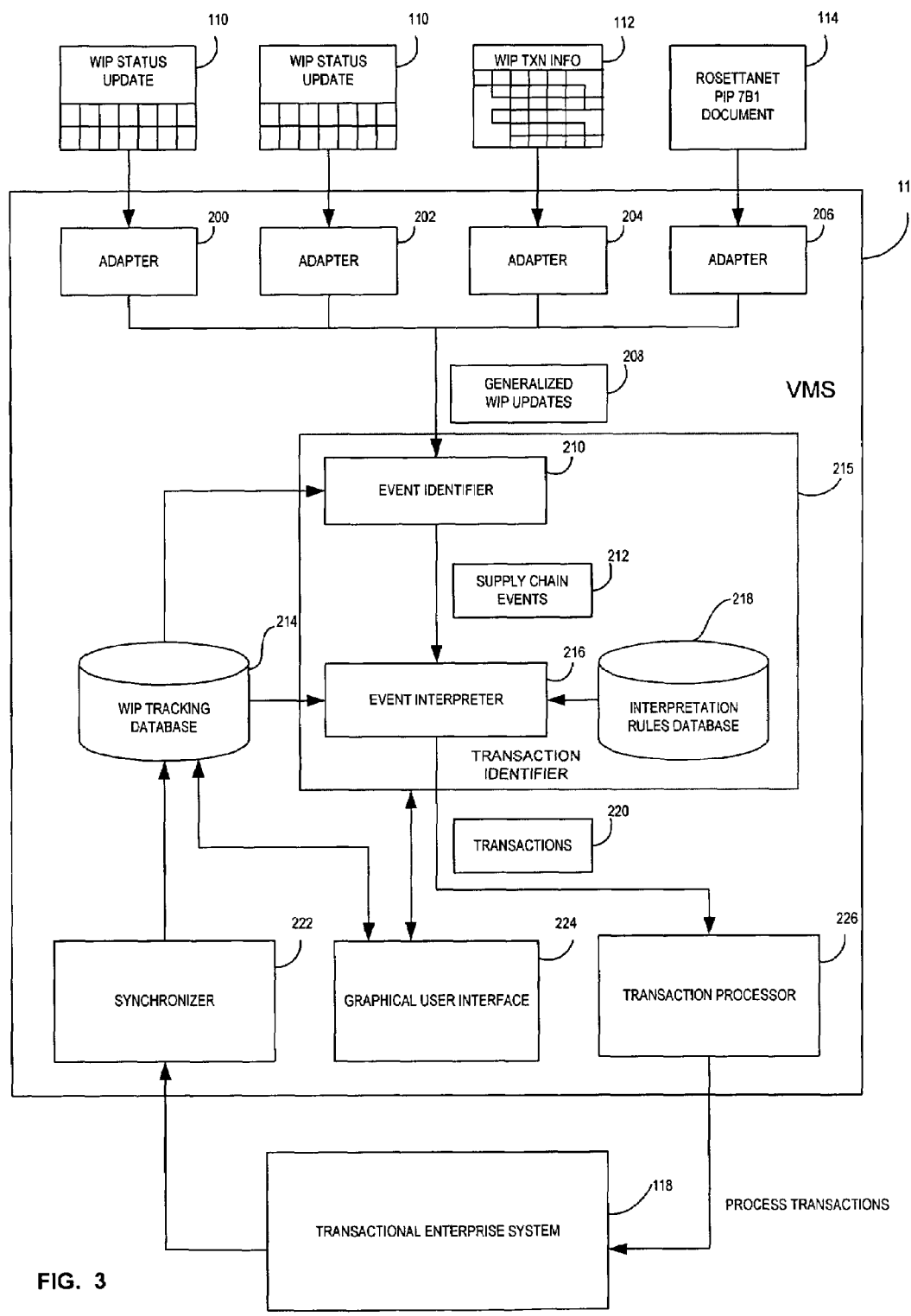
FIG. 3 is a schematic diagram of one embodiment of a virtual manufacturing system according to the invention.

FIG. 3 shows one embodiment of the VMS 116. This VMS 116 includes various supplier Adapters 200, 202, 204, 206, a Transaction Identifier 215 (which is implemented in this example by an Event Identifier 210 coupled to an Event Interpreter 216, which accesses an Interpretation Rules Database 218), a WIP Tracking Database 214, a Synchronizer 222, a Graphical User Interface 224, and a Transaction Processor 226. Components 210, 216, 222, and 224 can access the WIP Tracking Database 214. The Graphical User Interface 224 can also access the Transaction Identifier 215. Data (e.g., WIP updates) flows from the supplier systems to the respective Adapters 200, 202, 204, 206 to the Event Identifier 210 to the Event Interpreter 216 to the Transaction Processor 226 to the Transactional Enterprise System 118. Data can also flow from the Transactional Enterprise System 118 to the Synchronizer 222 to the WIP Tracking Database 214.

The system operates as follows. The Adapters 200, 202, 204, and 206 receive WIP updates 110, 112, and 114 from supplier systems and convert them from supplier-specific data formats into Generalized WIP Updates 208. In this example, the Generalized WIP Updates 208 share a common data format that supports both status and transactional data representations. The Synchronizer 222 updates the WIP Tracking Database 214 based on the Transactional Enterprise System 118. The Transaction Identifier 215 identifies Transactions 220, typically by comparing the Generalized WIP Updates 208 to previous WIP status, as stored in the WIP Tracking Database 214. In this particular implementation, this occurs in two steps. The Event Identifier 210 processes the Generalized WIP Updates 208 to identify Supply Chain Events 212, and the Event Interpreter 216, with the aid of the Interpretation Rules Database 218, converts these events into Transactions 220. These Transactions 220 are linked and ordered for interdependency and sent to the Transaction Processor 226. The Transaction Processor 226 employs an interface method specific to the Transactional Enterprise System 118 to process the Transactions 220 and update the Transactional Enterprise System 118. The Graphical User Interface 224 may be used to view or modify data within the VMS 116.

In one implementation, the WIP Tracking Database 214 and the Interpretation Rules Database 218 are implemented using an Oracle Database. The different components 200, 202, 204, 206, 210, 212, 216, 220, 224, and 226 are implemented using Java classes, Java servlets, XML, XSLT, and Java server pages (JSP). Portions of the Synchronizer 222 are implemented as PL/SQL stored procedures.

In more detail, the Adapters 200, 202, 204, and 206 encapsulate the logic to receive/retrieve WIP updates 110, 112, and 114 from supplier systems, typically using supplier-specified communication mechanisms. The term "receive" is used loosely here. For example, if WIP updates are transmitted from a supplier to the end customer and not to the VMS 116, an adapter may include the capability to intercept the WIP update before it reaches the customer. The Adapters can also validate WIP updates and/or convert the WIP updates from supplier-specific data formats into Generalized WIP Updates 208. In one implementation, the Generalized WIP Updates 208 are implemented as an XML document. FIG. 3 shows one adapter for each supplier but a one to one correspondence is not required.

The Event Identifier 210 receives the Generalized WIP Updates 208 and processes them to identify Supply Chain Events 212. It typically does this by comparing the Generalized WIP Updates 208 with the previous WIP status, which is stored in the WIP Tracking Database 214. Examples of Supply Chain Events 212 that are applicable to semiconductor manufacturing include the following: lot start, lot split, lot merge, lot scrap, and lot update. A lot start event identifies that processing for a new lot has begun. A lot split event identifies that one lot has been broken into two or more lots. A lot merge event identifies that two or more lots have been combined into a single lot. A lot scrap event identifies that the entire quantity of a lot has been lost. A lot update event identifies that a change has occurred in one or more properties of a lot, such as a quantity gain or loss, a change in the projected completion date, or a change in a lot's process step.

The Event Interpreter 216 translates the set of Supply Chain Events 212 received from the Event Identifier 210 into a set of supply chain Transactions 220. Examples of Transactions 220 that are applicable to semiconductor manufacturing include the following: START, MOVE, BONUS, SCRAP, SPLIT, MERGE, and UPDATE. A START transaction is used to create a new lot. A MOVE transaction is used to move a lot from one logical operation to another. A BONUS transaction is used to increase the quantity of a lot. A SCRAP transaction is used to reduce the quantity of a lot. A SPLIT transaction is used to break one lot into two or more lots. A MERGE transaction is used to combine two or more lots into a single lot. An UPDATE transaction is used to change the properties of a lot, such as a change in the projected completion date.

Multiple attributes may change for the same lot during the time period between two consecutive WIP status updates provided by the supplier. For example, the lot may move to the next step, lose some quantity, and then may split, producing a child lot. The Event Identifier 210 may identify this primarily as a split event. However, the particular target Transactional Enterprise System 118 may require the application of multiple transactions to achieve the desired end status for the lots involved. In the example above, a MOVE transaction may be applied to move the lot, a SCRAP transaction may be applied to account for the quantity loss, and a SPLIT transaction may be applied to create the child lot. Thus, a single event may be interpreted as multiple transactions, which may have to be processed in a certain order. The specific rules required for accurate event interpretation will depend upon the target Transactional Enterprise System 118.

The Interpretation Rules Database 218 provides a configurable repository for ordered lists of rules. For example, it can include rules for maintaining transaction dependencies when an identified Supply Chain Event 212 is interpreted as multiple transactions. In one embodiment, the Interpretation Rules Database 218 also has rules that define the order of precedence for transactions, such as "scrap before move." This rule ensures that, if an event is interpreted into a scrap transaction and a move transaction, the scrap transaction is to be performed before the move transaction.

The Transactions 220 are linked and ordered for interdependency and sent to the Transaction Processor 226. The Transaction Processor 226 employs an interface method specific to the Transactional Enterprise System 118 to process these Transactions 220 and update the Transactional Enterprise System 118. In one embodiment, the Transaction Processor 226 employs an interface to an Oracle ERP system. In another embodiment, the Transaction Processor 226 provides RosettaNet WIP transactions as specified in the RosettaNet PIP 7B1. In yet another embodiment, the Transaction Processor 226 may provide interfaces to multiple Transactional Enterprise Systems 118, each of which may require different interface methods.

Enterprise systems (such as MES, ERP, and SCM systems) often are used to maintain the master data for all suppliers, supplier processes, products, part numbers, lots, and so forth. The WIP Tracking Database 214 preferably holds a minimal subset of enterprise data that is necessary for WIP tracking and related operations. This typically includes information such as part numbers, supplier processes, and lot data. The Synchronizer 222 extracts this information from the Transactional Enterprise System 118 and refreshes the WIP Tracking Database 214 with up-to-date information as needed. Preferably, this is done immediately prior to processing each WIP update.

The present invention has numerous advantages. The VMS 116 can be implemented so that it does not require software to be installed on supplier sites. This is because it is based on a non-invasive "pull and process" architecture. In practice, this means that a company does not depend on interaction with suppliers to address systems integration issues. The VMS 116 also provides a flexible solution that can be easily deployed by a company for its entire supply chain, as it accepts a full range of available types of WIP updates currently in use in the semiconductor industry, including WIP Status Updates 110, WIP Transactional Updates 112, combinations of status and transactional WIP updates, and RosettaNet WIP PIPs 114.

The VMS 116 can also provide significant reduction in ongoing operational costs by automating the processing of WIP update directly into Transactional Enterprise Systems 118. The VMS 116 can also provide a significant reduction in the time and cost required to integrate information from new suppliers into a company's Transactional Enterprise System 118, since integrating WIP updates from new suppliers is a relatively straightforward matter of data conversion to produce Generalized WIP Updates 208. Finally, the VMS 116 can provide transactional data, such as RosettaNet transactions, to the Transactional Enterprise Systems 118 of other companies, including, but not limited to, customers, suppliers, distributors, and so forth. The above advantages make the present invention a flexible and cost effective solution for integrating WIP updates from the disparate systems of an entire semiconductor supply chain.

The present invention can provide benefits to semiconductor manufacturing suppliers, fabless semiconductor companies, semiconductor manufacturing data collection service providers, and customers of fabless semiconductor companies. For example, in one scenario, a fabless semiconductor company such as eSilicon Corporation of Sunnyvale, Calif. uses the VMS 116 to integrate WIP updates from its suppliers into its Oracle ERP system. In another scenario, a semiconductor manufacturing supplier whose systems can only provide WIP status updates can use the VMS 116 to provide transactional data to its customers. In yet another scenario, a WIP data collection service provider can use the VMS 116 to collect WIP updates from a variety of suppliers and provide transactions to the Transactional Enterprise Systems 118 of the provider's customers.

FIGS. 4-11 provide further details and examples.

Customers that engage with multiple suppliers face a number of challenges in attaining a unified view of WIP in the supply chain. First, suppliers use a variety of different manufacturing processes for different products. Each of these processes may consist of different steps. Second, the same process at different suppliers may be reported differently. The names of steps often differ from one supplier to the next, as do the number of steps reported by each supplier for any given process. Finally, some supplier processes, such as wafer fabrication, may consist of hundreds of steps. Customers typically do not want or need to track WIP at this level of granularity. As a result of these factors, it is useful to group these supplier steps into a smaller number of high-level logical operations at a coarser level of granularity, as described further below. These logical operations are reflected in the Generalized WIP Updates 208.

Figure 4:
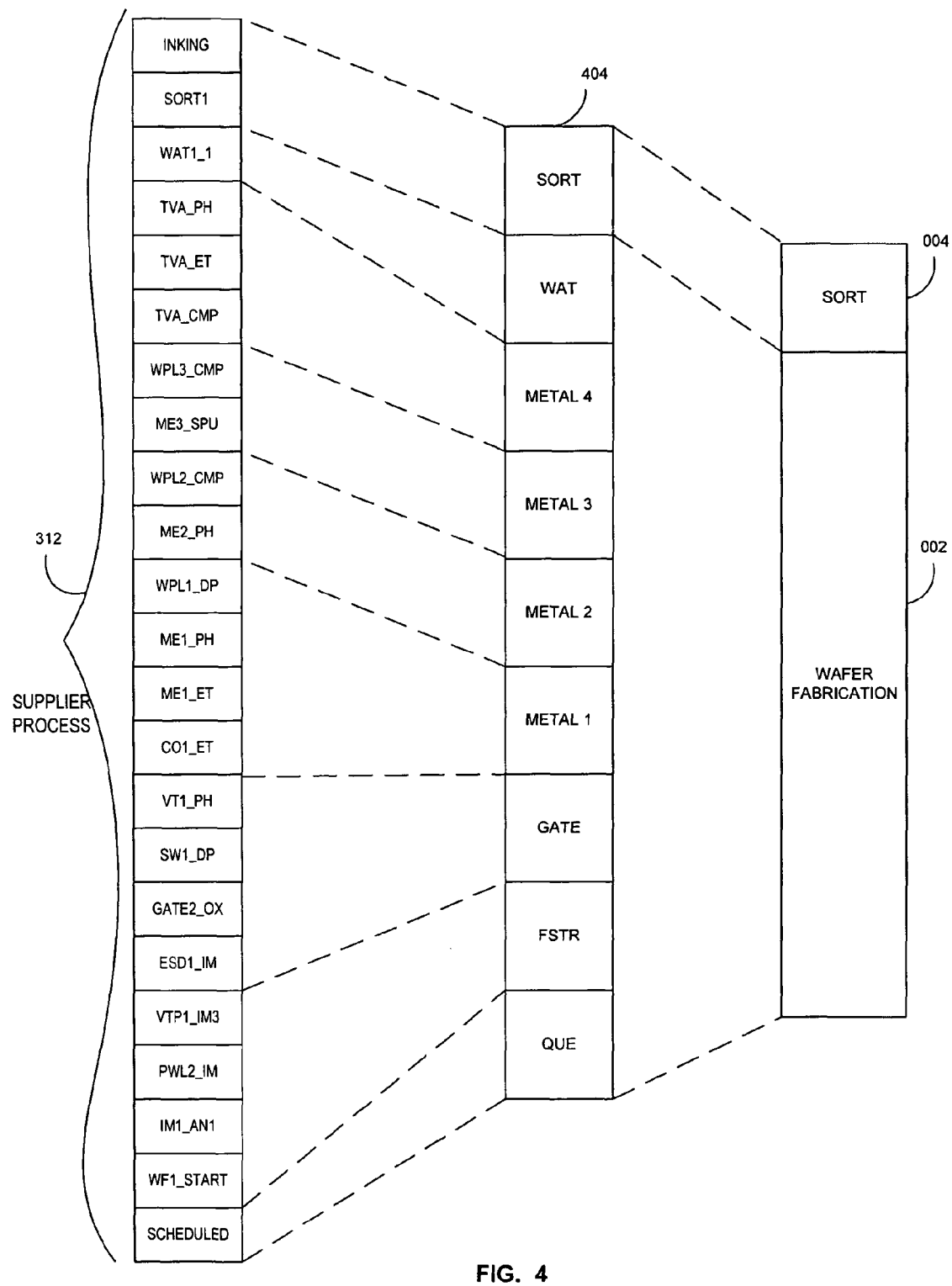
FIG. 4 illustrates an example of mapping a supplier's process to a predefined set of operations.

FIG. 4 illustrates an example in more detail. In this example, the semiconductor supply chain process is modeled as a predefined set of logical operations 404, and the supplier steps in WIP status updates are mapped to the predefined logical operations 404. As mentioned above, logical operations 404 typically have a coarser granularity than the steps defined in the supplier's process. Thus, there typically will be a many to one mapping of steps in the supplier's process to the logical operations 404 and the processes of different suppliers typically will be mapped to the same sequence of logical operations 404.

FIG. 4 shows an example flow for a wafer fabrication and sort process 312 of Supplier A 010 in FIG. 1A, mapping to coarser sequence of logical operations 404. The order of the steps in 312 progresses from SCHEDULED to INKING, and the order of logical operations 404 progresses from QUE to SORT. Since processes such as 312 may consist of hundreds of steps, only a small subset of steps is shown in FIG. 4, sufficient to illustrate the concept of a coarse-grained view. As shown in FIG. 4, multiple supplier steps from supplier process 312 are grouped into logical operations 404. For example, process steps ESD1_IM (ESD implant), GATE2_OX (core transistor gate oxide deposition), SW1_DP (spacer deposition), and VT1_PH (adjustment implant mask) in FIG. 4 are all mapped to the logical operation GATE. The logical operations 404 are the predefined set of operations to which supplier steps in Generalized WIP Updates 208 are mapped before processing by the Transaction Identifier 215.

Figure 5A:
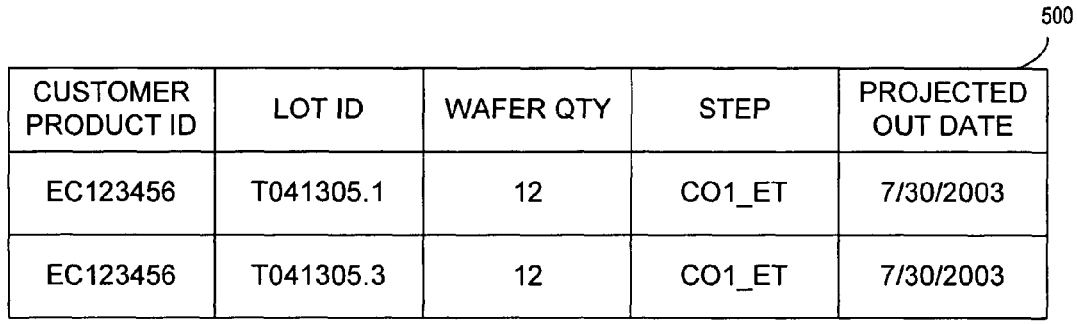
FIG. 5A illustrates an example of a WIP status update from a FAB supplier.
Figure 5B:
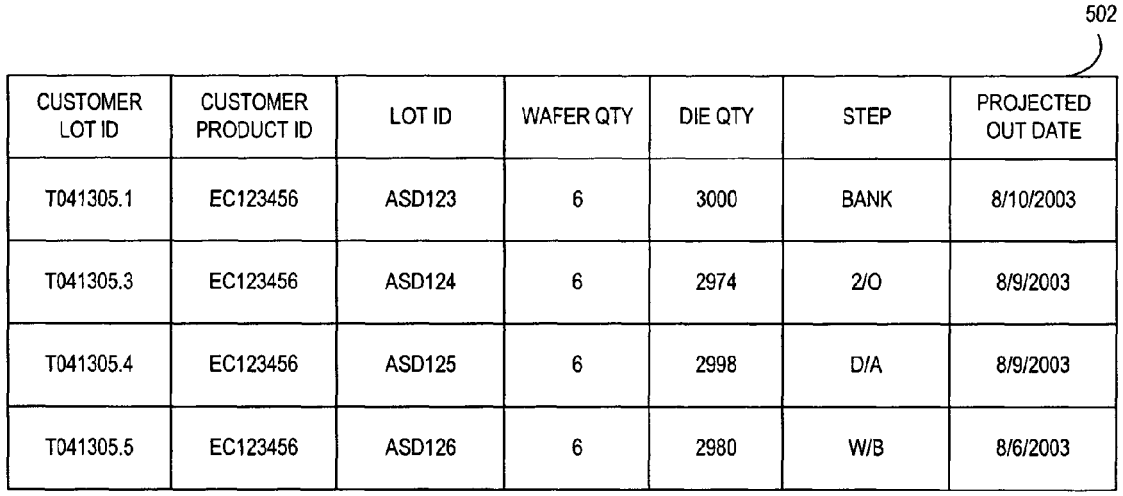
FIG. 5B illustrates an example of a WIP status update from a non-FAB supplier.

FIG. 5A illustrates some of the attributes of a WIP Status Update 110 from wafer fabrication Supplier A 010 in FIG. 2, which can be used in the identification of lot events. Each line in the WIP status update represents an update for a given lot. A given WIP status update may contain lot updates for one or more customer products. The Customer Product ID represents the customer product being manufactured by the supplier. Typically, it is assigned by the customer. The Lot ID represents the unique identifier for a given lot, as assigned by the supplier. The Wafer Quantity represents the current quantity of wafers in the lot. The Step represents the current location of the lot in the supplier process. Steps are defined by the supplier and, as discussed previously, different suppliers may use different steps to represent the same process. The Projected Out Date represents the date that the supplier expects to complete the processing of the lot. FIG. 5B illustrates an example of a WIP Status Update 110 from a downstream assembly supplier (not shown in FIG. 2). In addition to the attributes provided by the wafer fabrication Supplier A 010 in FIG. 5A, FIG. 5B shows the unique Customer Lot ID provided to the downstream assembly supplier by the customer, as well as the Die Quantity, or quantity of die in the lot.

The lot numbers used by most semiconductor manufacturers have a consistent representation. Typically, this consists of a main lot ID, followed by a separator, which is followed by a split code. For example, in FIG. 5A, the lot ID for the top row is "T041305.1". The main lot ID is "T041305". The separator is the "." character. The lot split code is "1". The lot ID representation described above can be significant, as it can be used to group related lots for identification of Supply Chain Events 212 in FIG. 3 from status updates. However, it is possible that a different supplier may not use this notation and may simply represent the Lot ID as an alphanumeric character string without any separator and split code. In this case, alternate grouping strategies may be employed, such as grouping by the Product ID, Customer Lot ID or other data provided by that particular supplier.

As discussed above, Supply Chain Events 212 are identified from the WIP status updates. The Supply Chain Events 212 can be identified by comparing new lot statuses contained in the Generalized WIP Updates 208 with the previous known statuses of the lots in the WIP Tracking Database 214. The new lot status in the Generalized WIP Updates 208 contains the corresponding logical operation mapped from the appropriate supplier process step. For example, the logical operation of GATE in 404 may be derived from the step of SW1_DP in Supplier Process 312 as shown in FIG. 4.

Figure 6:
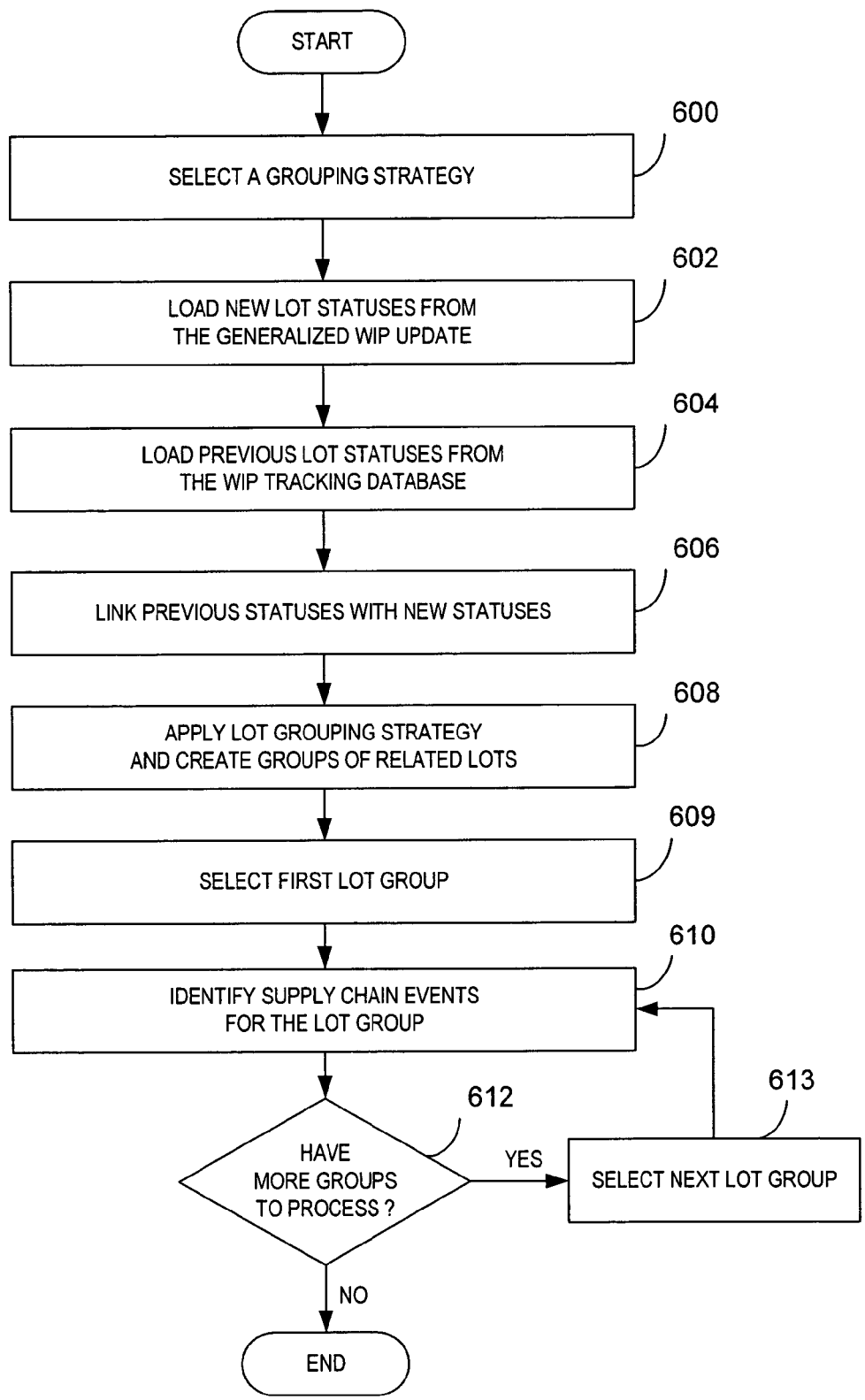
FIG. 6 is a flow chart illustrating one method for grouping and processing lots for identification.
Figure 7A:
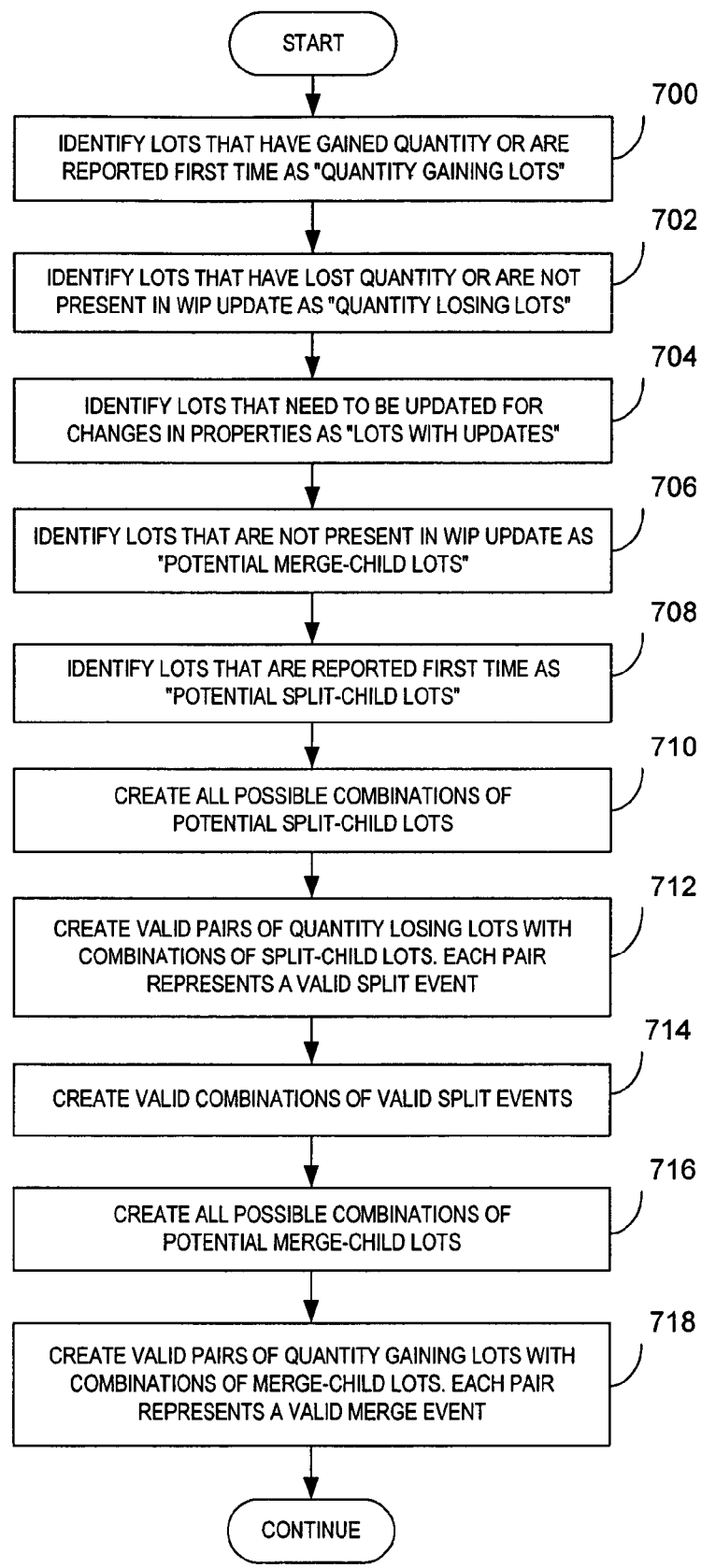
FIGS. 7A-7B is a flow chart illustrating one method for identifying supply chain events.
Figure 7B:
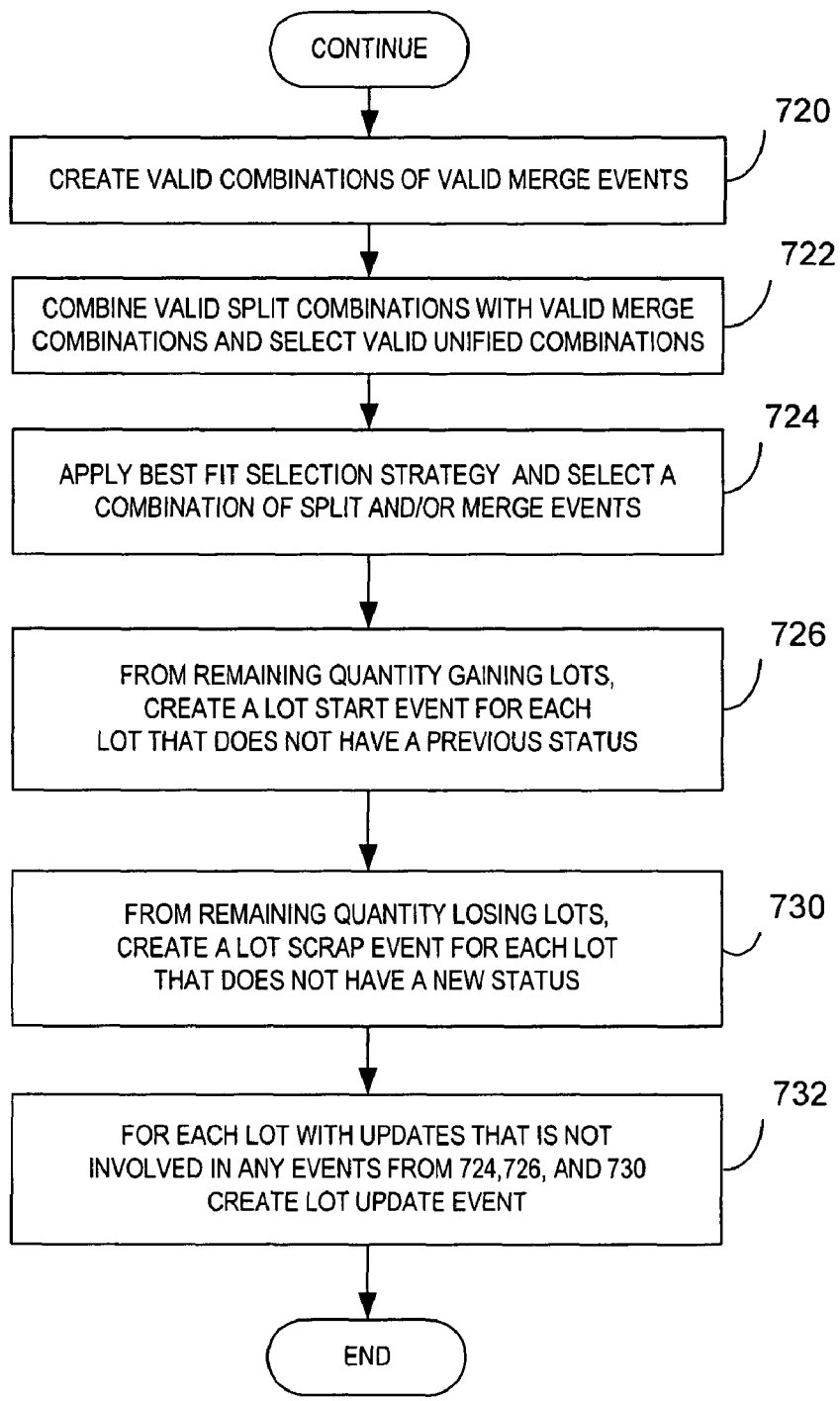
Figure 8:
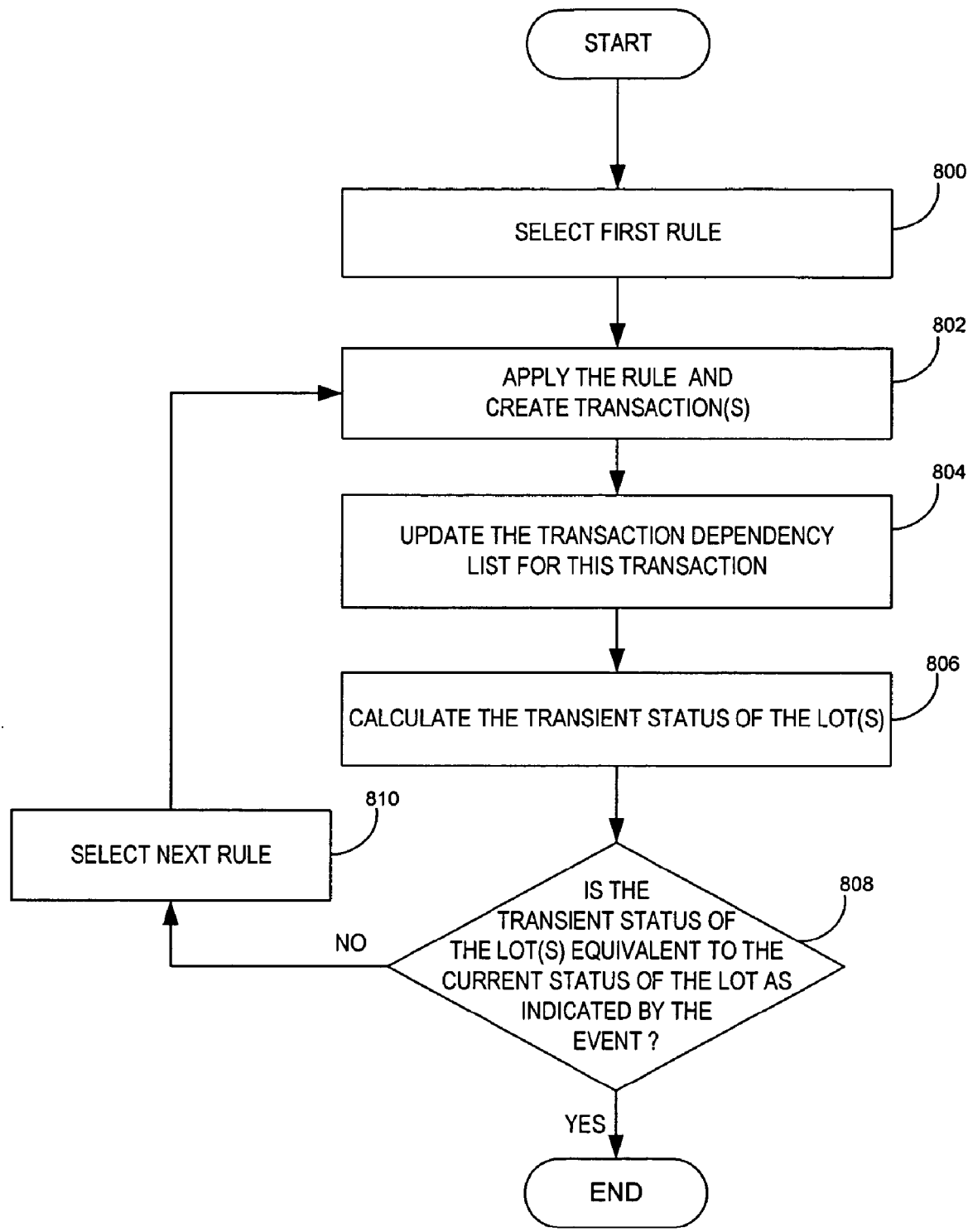
FIG. 8 is a flow chart illustrating one method for interpreting supply chain events as transactions.

FIGS. 6-8 illustrate one example for identifying events from WIP Status Updates and for identifying transactions from events. For split and merge event identification, various combinations of quantity gaining lots and quantity losing lots are evaluated. To reduce the possible number of combinations to be evaluated, various criteria can be used to narrow the set of lots that may produce these combinations. Typically suppliers do not split or merge unrelated lots, such as lots that have different Customer Product ID's, Customer Lot ID's, or Main Lot ID's. Such information can be used to implement various grouping strategies for lots whose combinations are then evaluated to identify split and merge events. In other words, rather than evaluating all possible combinations of lots represented in a Generalized WIP Update 208 in order to resolve merge and split possibilities, the lots are grouped and combinations within each group are evaluated. Three grouping strategies discussed below are grouping by Customer Product ID, grouping by Main Lot ID, and grouping by Customer Lot ID.

FIG. 6 is a flow chart for grouping and processing lots for event identification purposes. In the system of FIG. 3, these steps are implemented primarily by the Event Identifier 210, although they can be implemented by different components in alternate systems. Step 600 selects an appropriate lot grouping strategy for the Generalized WIP Update 208 being processed. The grouping strategy selected typically is based on multiple factors related to the content of the WIP status update provided by the supplier, for example whether the supplier's lot number follows a certain scheme for lot numbering, whether the Customer Lot ID is provided, and so forth.

The Event Identifier 210 loads 602 the new status of lots from the Generalized WIP Update 208. The new status includes information from the original WIP Status Update 110 provided by the supplier (e.g., Lot ID, quantity, supplier step, and Customer Lot ID if provided) and also the logical operation 404 mapped from the supplier step.

The WIP Tracking Database 214 stores lot status information of all lots for which WIP updates have previously been received from various suppliers; such information is referred to as the previous status of a given lot. The Event Identifier 210 loads 604 any required previous lot statuses from the WIP Tracking Database 214. This typically includes all lots present in the Generalized WIP Update 208, as well as all other lots at the supplier from which the Generalized WIP Update 208 was received In order to identify the changes that have occurred, the new status of a lot is compared to the previous status of the lot, and this requires creating an association, or link, between the two statuses. Step 606 links the previous and new statuses for each lot. The links between previous and new lot statuses can be determined by matching a Lot ID or Customer Lot ID for each new status with the Lot ID or Customer Lot ID in a previous status. Under various conditions, a lot may have only a new status, only a previous status, or both new and previous statuses. For example, when a lot is reported for the first time, there will only be a new status. When one lot is merged into another lot, there will only be a previous status for the lot that was merged into the other lot.

The Event Identifier 210 applies 608 the previously selected lot grouping strategy to create groups of lots whose combinations may be evaluated to identify various Supply Chain Events 212. One advantage of creating these groups of lots is to reduce the number of possible combinations that are evaluated.

Steps 609-613 loop through the different lot groupings. The Event Identifier 210 selects 609 a first grouping and identifies 610 various Supply Chain Events 212 that have happened to the member lots of the currently selected group. The Event Identifier 210 checks 612 to see if there are more groups of lots to be processed. If so, the next group of lots is selected 613 for processing 610. If there are no more lot groupings, then the processing for all groups has been completed.

Consider that a single WIP update may contain multiple splits and/or merges. The technical challenge is to identify the particular combination of split and merge events that would yield the reported status. The following steps describe one implementation of an algorithm to achieve this goal. Generally speaking, this algorithm identifies all possible valid split and merge events, evaluates all possible valid combinations of these events, and then selects a "best fit" combination of split and merge events.

FIGS. 7A-7B illustrates a flowchart for an algorithm that is used by step 610 to identify various Supply Chain Events 212 from a lot group. Step 700 identifies lots that have a greater quantity than in their previous status as "quantity gaining lots." Lots that are being reported for the first time are also classified as "quantity gaining lots." This is useful because any such gain may have occurred as a result of a merge event, i.e., this is potentially a parent lot in a merge event. Similarly, step 702 identifies lots that have less quantity than in their previous status as "quantity losing lots." Lots with a previous status which were expected but not included in the WIP update being processed are also classified as "quantity losing lots." This is useful because any such loss may have occurred as a result of a split, i.e., this is potentially a parent lot in a split event. Step 704 identifies lots that have both a previous and a new status in which any significant fields for WIP tracking have changed as "lots with updates." These include lots which have changes in quantity, process step, projected out date, and so forth.

Steps 706 to 722 identify various valid split and merge event combinations by evaluating all the possible combinations of lots that have gained and lost quantities. Step 706 identifies lots with a previous status which were expected but not included in the WIP update being processed as "potential merge child lots." These lots may have been merged into another "parent" lot. Note that these same lots were also identified in step 702 as "quantity losing lots." Step 708 identifies lots that are being reported for the first time as "potential split child lots." These lots may have been split from another "parent" lot. They are also classified as "quantity gaining lots."

Various valid split events can be identified by combining potential split parents from 702 with combinations of potential split children from 708. Steps 710, 712 and 714 identify any potential combinations of split events that could occur simultaneously. Step 710 creates all possible combinations of split children from 708, which shall be referred to as the "power set" of split children. Step 712 combines each of the split parent lots from 702 with each of the split child combinations from 710 to create pairs representing all potential split events, and then selects only the valid pairs. Each valid pair represents a valid split event that may have occurred. In this example, the validation criteria are: (a) the total new quantity of all lots involved in a split cannot be more than the previous quantity of the parent lot; and (b) none of the resulting lots can be in a processing step that is prior to the processing step indicated by the previous status of the parent lot. For example, referring to FIG. 4, if the parent lot has a previous status that is in ME3_SPU, none of the resulting lots can have a new status that is in WPL2_CMP (or earlier). Step 714 creates the power set (all possible combinations including the empty set) from the set of valid split events created in 712 and then selects only valid combinations. For a combination to be valid, a lot cannot participate in more than one split event at the same time.

A similar approach is taken for merge events. Various valid merge events can be identified by combining potential merge parents from 700 with combinations of potential merge children from 706. Steps 716, 718 and 720 identify any potential merge event combinations that can occur simultaneously. Step 716 creates all possible combinations of merge children from 706 (i.e., the "power set" of merge children). Step 718 combines each of the merge parent lots from 700 with each of the merge child combinations from 716 to create pairs representing all potential merge events, and then selects only valid pairs. Each valid pair represents a valid merge event that may have occurred. The validation criteria are (a) the new quantity in the parent lot in a merge cannot be more than the total of the previous quantities of all lots involved in the merge; and (b) the new status of the parent lot cannot be in a processing step that is prior to that of any child lot. Step 720 creates the power set (all possible combinations including the empty set) from the set of valid merge events created in 718 and then selects only valid combinations. For a combination to be valid, a lot cannot participate in more than one merge event at the same time.

Step 722 identifies valid "unified" event combinations that contain split and merge events that can occur simultaneously. To do this, 722 first combines each of the valid split event combinations from 714 with each of the valid merge event combinations from 720 to create a set of event combinations where each member may have multiple split and/or merge events, and then selects only valid combinations. For a unified event combination to be valid, a lot cannot participate in more than one event at the same time.

Step 724 applies a best-fit selection strategy to select one of the valid unified event combinations. First, 724 selects the combinations that involve the maximum number of lots. If this criteria yields more than one combination, then 724 selects the combinations that yield the minimum quantity of scrap material. If these criteria yield more than one combination, then 724 may apply further optimization algorithms (such as those based on minimizing the movement of material) to select a single combination.

Steps 726 to 732 process the remaining lots (i.e., those not involved in the previously selected best-fit unified event combination) to identify the remaining types of events: lot start events, lot scrap events, and lot update events. From the quantity gaining lots from 700 that are not included in the combination selected by 724, step 726 creates lot start events for lots with no previous status. From the quantity losing lots from 702 that are not included in the combination selected by 724, step 730 creates lot scrap events for lots with no new status. For the lots with updates from 704 that are not included in any of the events identified in the previous steps (i.e., 724, 726, and 730) step 732 creates lot update events.

FIGS. 6-7 show one example of identifying Supply Chain Events 212 in FIG. 3 (and ultimately, Transactions 220) from WIP status updates. Other approaches will be apparent. For example, in FIG. 6, different grouping strategies and different approaches to linking new and previous lot statuses can be used. As another example, steps 700-708 may be replaced with different classifications of lots. The identification of possible split and merge events can occur using approaches other than the exhaustive approach of steps 710-714, 716-720 and 722. As mentioned above, different criteria can be used to identify which of the possible split and merge events is the "best fit."

FIG. 8 illustrates a flow chart of the algorithm used by the Event Interpreter 216 in FIG. 3 to convert each of the Supply Chain Events 212 identified by the Event Identifier 210 into Transactions 220. The Event Interpreter 216 takes the previous and current lot statuses identified by the current Supply Chain Event 212, extracts all applicable rules from the Interpretation Rules Database 218, and applies these rules iteratively to create an ordered list of Transactions 220 that may be applied to reflect the resulting lot statuses in the Transaction Enterprise System 118.

For each event, the Event Interpreter 216 extracts the applicable ordered list of rules from the Interpretation Rules Database 218. Step 800 selects the first rule in the ordered list. Step 802 applies the selected rule, creating zero or more Transaction(s) 220, as appropriate. Step 804 updates the transaction dependency list to indicate that each newly created transaction is dependent on the previously created transaction(s), if any, for the lot(s) involved in that transaction. Step 806 calculates the transient status of the lot to which the transaction will be applied (as if the transaction has been performed). This transient lot status will be used as the starting lot status for the subsequent transaction. Step 808 compares the transient statuses derived in 806 to the new lot statuses of the current event. If these statuses are not equivalent, 810 will select the next rule in the list and proceed to 802 for further processing of this event.

Figure 9A:
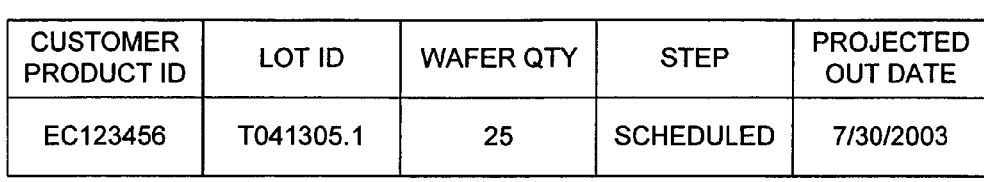
FIGS. 9A-9F illustrate an example scenario of consecutive WIP status updates from a FAB supplier corresponding to various events, including lot start, lot update, lot split, and lot merge events.
Figure 9B:
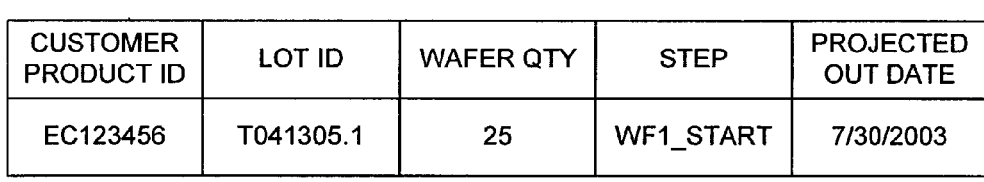
Figure 9C:
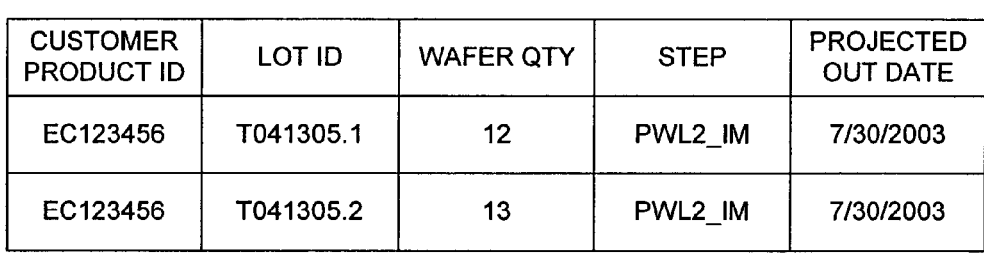
Figure 9D:
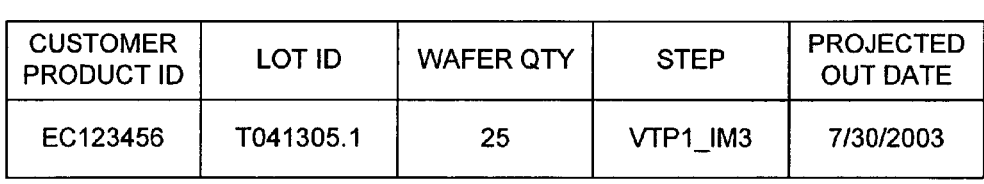
Figure 9E:
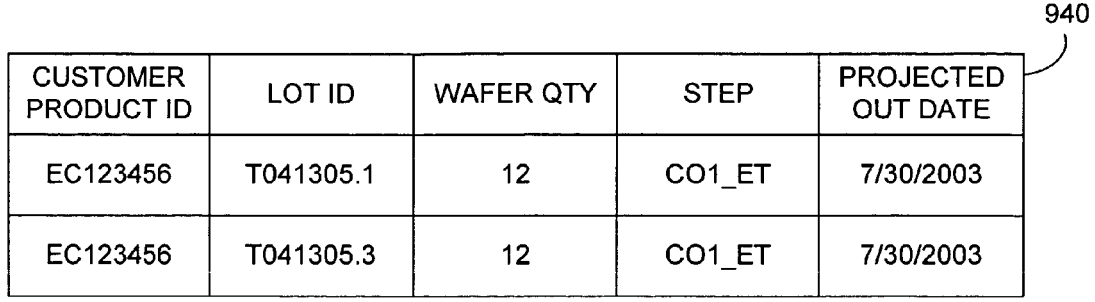
Figure 9F:
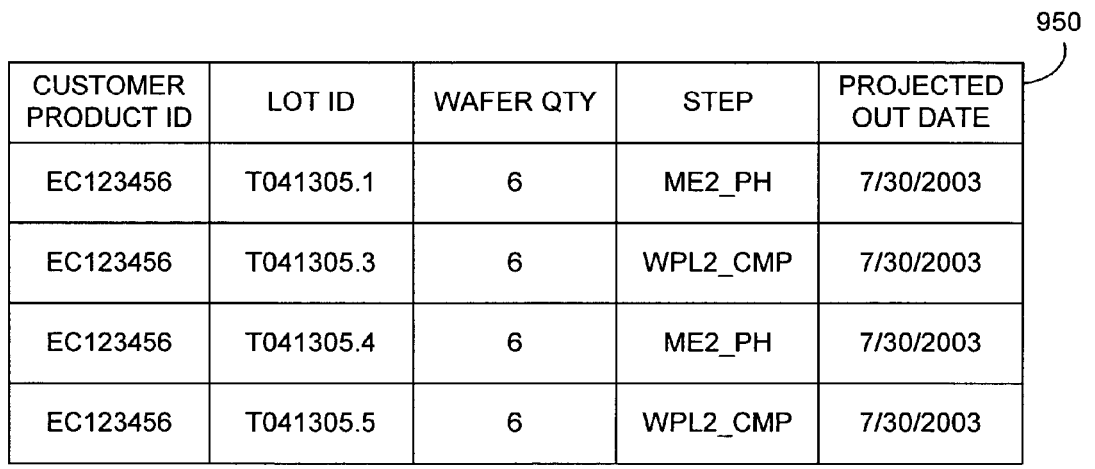
Figure 9G:
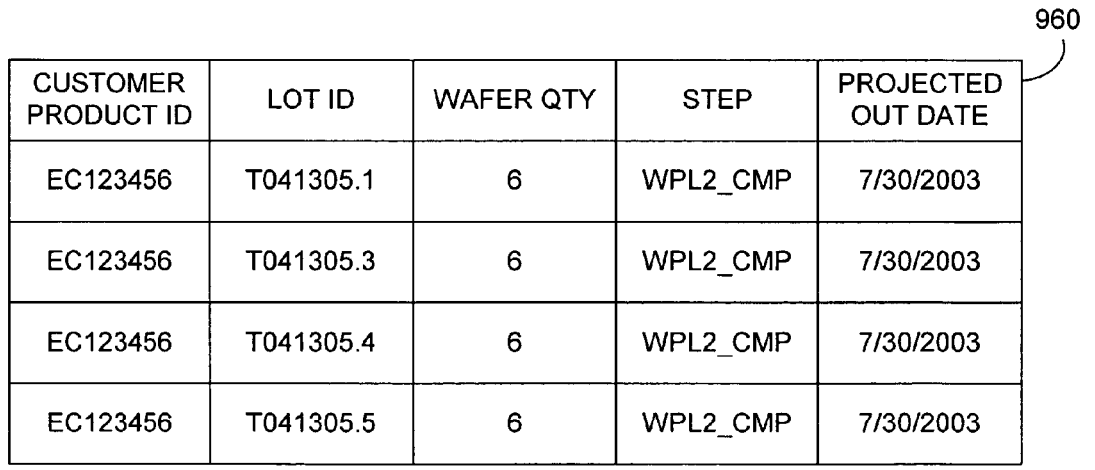
FIG. 9G is a sample WIP status update that provides an example scenario illustrating ambiguity in event identification.
Figure 10:
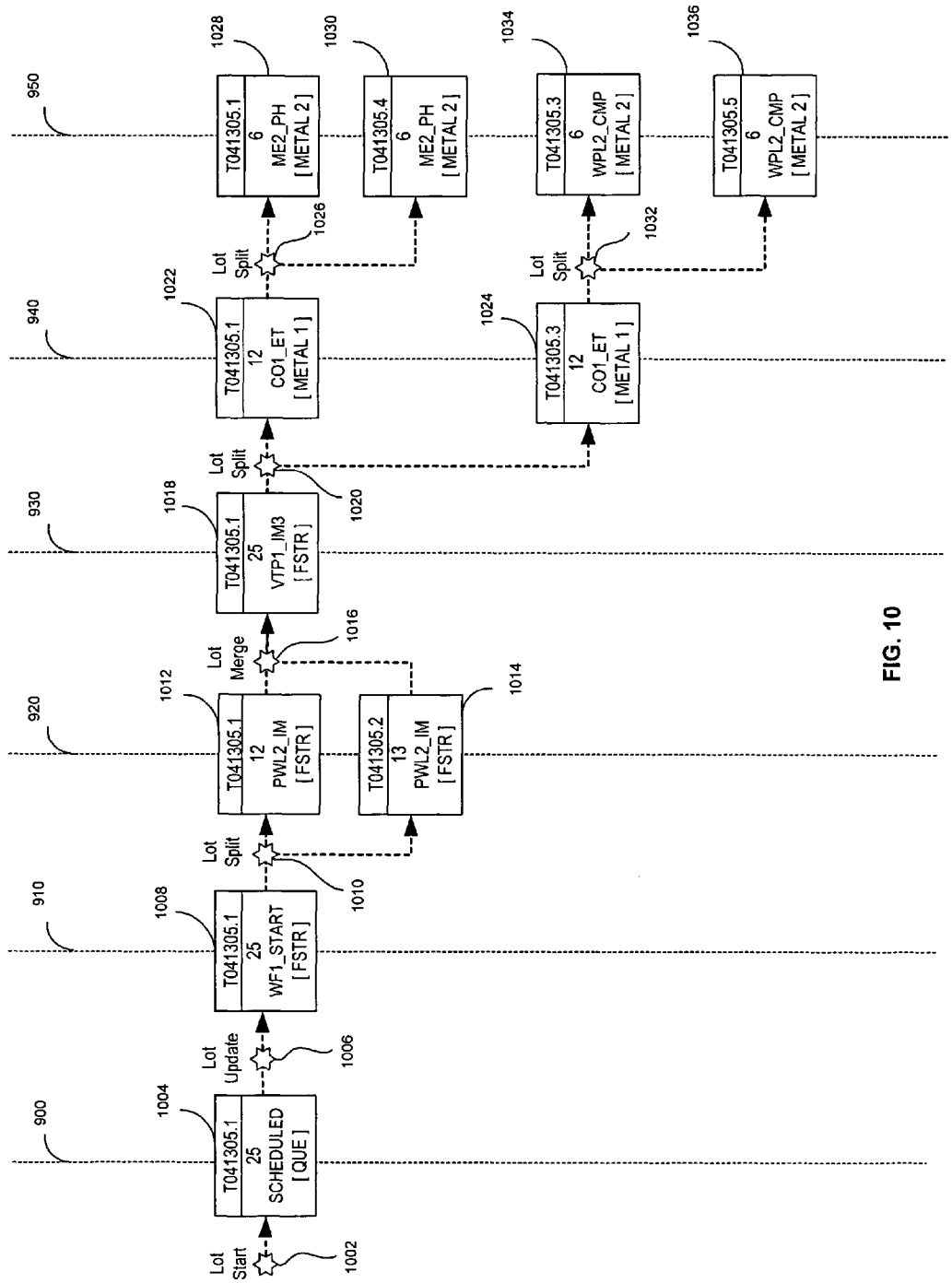
FIG. 10 illustrates a sequence of supply chain events identified by processing the WIP status updates illustrated in FIGS. 9A-9F.
Figure 11A:
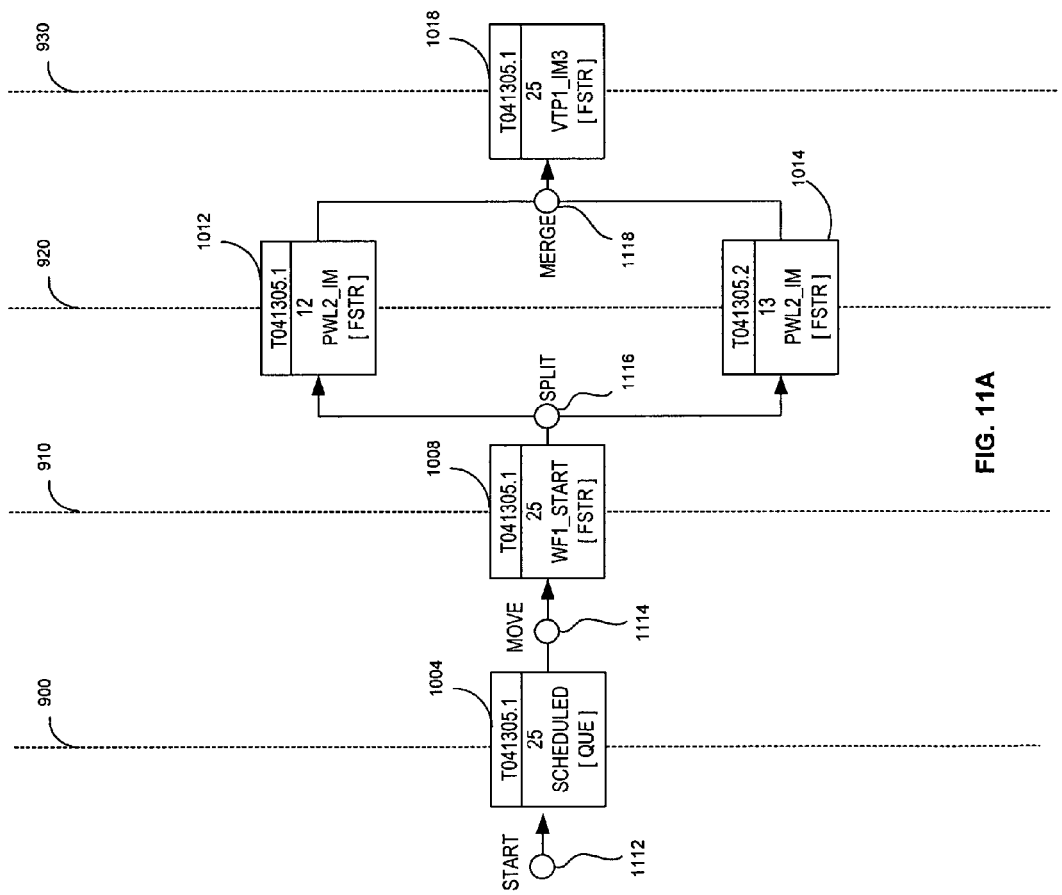
FIGS. 11A-11B illustrate a sequence of transactions and their dependencies created by processing the WIP status updates illustrated in FIGS. 9A-9F.
Figure 11B:
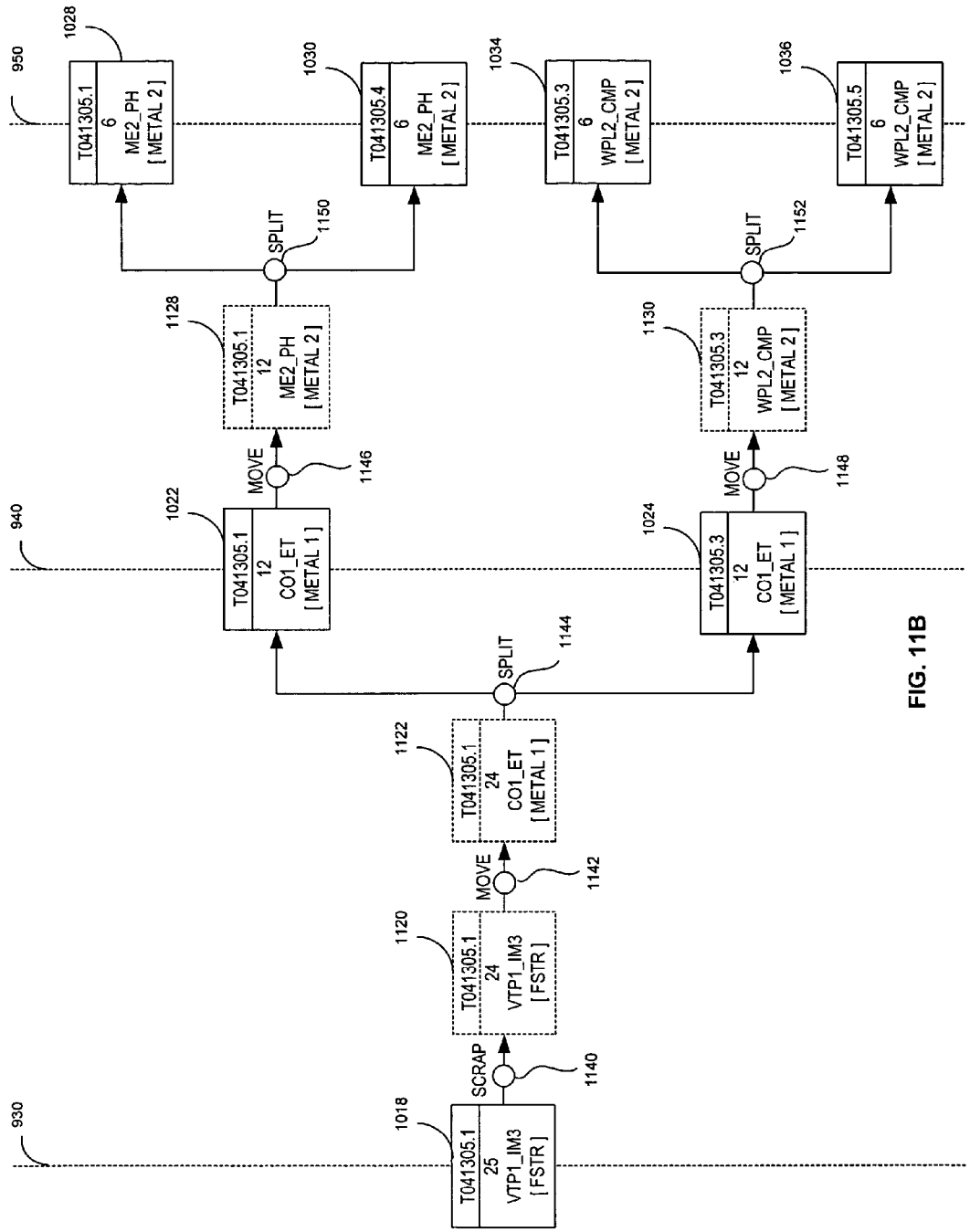

FIGS. 9-11 illustrate an example of identifying Transactions 220 in FIG. 3 from WIP Status Updates 110, using the systems and methods described above. FIGS. 9A-9F illustrate a scenario consisting of six WIP Status Updates 110 from a single supplier in chronological order. FIG. 10 illustrates the corresponding lot statuses and the Supply Chain Events 212 that are identified when the Event Identifier 210 in FIG. 3 processes the WIP status updates 900 to 950 in FIGS. 9A-9F. FIGS. 11A-11B illustrate the sequence of Transactions 220 identified by the Event Interpreter 216 in FIG. 3 by processing the Supply Chain Events 212.

In FIG. 10, the identified events are represented by the stars 1002, 1006, 1010, 1016, 1020, 1026, and 1032. The lot statuses are represented by the blocks 1004, 1008, 1012, 1014, 1018, 1022, 1024, 1028, 1030, 1034, and 1036. Each lot status block has a consistent representation including the lot ID, quantity of the lot, the supplier step, and the [logical operation] to which the supplier step is mapped. The vertical dotted lines in FIG. 10 with labels 900 to 950 reference the corresponding WIP status updates in FIGS. 9A-9F. For example, lot status 1004 corresponds to WIP status update 900. Note that lot status can be either new or previous, depending on the frame of reference. Lot status 1008 is a new lot status relative to WIP status update 910 but a previous lot status relative to WIP status update 920.

In this example, the lot grouping strategy selected by 600 of FIG. 6 will group the lots by Main Lot ID "T041305." The basic task is to identify the Supply Chain Events 1002, 1006, 1010, 1016, 1020, 1026, and 1032 from the WIP status updates 900 to 950.

The WIP status update 900 shown in FIG. 9A consists of a single lot, which for the purposes of this example, does not exist in the WIP Tracking Database 214 in FIG. 3. Since the lot does not have a previous status, the Event Identifier 210 identifies this event as a Lot Start 1002 in FIG. 10 for lot T041305.1, in accordance with step 726 of FIG. 7B, with the resulting lot status 1004. The process step SCHEDULED in lot status 1004 is mapped to the logical operation QUE, as shown in FIG. 4.

The WIP status update 910 shown in FIG. 9B consists of one lot at process step WF1_START, which is mapped to the logical operation FSTR, as shown in FIG. 4. This results in the new lot status 1008. This new lot status 1008 is linked with the previous lot status 1004 because they have the same Lot ID. Since there is no change in quantity, the Event Identifier 210 in FIG. 3 identifies this event as a Lot Update 1006 in FIG. 10 from logical operation QUE to FSTR in accordance with 732 of FIG. 7B, consistent with the resulting lot status of 1008.

The WIP status update 920 shown in FIG. 9C consists of two lots at the same process step PWL2_IM, which is mapped to logical operation FSTR, as shown in FIG. 4. Since these two lots have the same Main Lot ID, they will be processed under the same lot group, and as the sum of the quantities of these two lots match the previous quantity of lot T041305.1, the Event Identifier 210 in FIG. 3 will identify this event as a Lot Split 1010 in FIG. 10 in accordance with steps 714 and 724 of FIG. 7A-7B, with resulting lot statuses of 1012 and 1014.

The WIP status update 930 shown in FIG. 9D consists of one lot at process step VTP1_IM3, which is mapped to logical operation FSTR, as shown in FIG. 4. Since the new lot quantity matches the sum of the quantities of the two previous lots (1012 and 1014) with the same Main Lot ID T041305, the Event Identifier 210 in FIG. 3 will identify this event as a Lot Merge 1016 with a resulting lot quantity of 25, in accordance with steps 720 and 724 of FIG. 7B, with a resulting lot status of 1018.

The WIP status update 940 shown in FIG. 9E consists of two lots at process step CO1_ET, which is mapped to logical operation METAL 1, as shown in FIG. 4. Since the two lots share the same Main Lot ID T041305, and the combined quantity of the two lots is only 24, the Event Identifier 210 in FIG. 3 will identify this event as a Lot Split 1020 in FIG. 10, in accordance with steps 714 and 724 of FIG. 7A-7B, with resulting lot statuses of 1022 and 1024. The loss of quantity from 25 to 24 will be handled by the Event Interpreter 216, which will be described further below.

The WIP status update 950 shown in FIG. 9F consists of 4 lots: lots T041305.1 and T041305.4, each with a quantity of 6, at process step ME2_PH; and lots T041305.3 and T041305.5, each with a quantity of 6, at process step WPL2_CMP. Both ME2_PH and WPL2_CMP are mapped to logical operation METAL 2, as shown in FIG. 4. The Event Identifier 210 in FIG. 3 will evaluate various combinations in accordance with steps 714 and 724 of FIG. 7A-7B. In this example, it selects the "best fit" combination of events as Lot Split 1026 and Lot Split 1032, with the resulting lot statuses of 1028, 1030, 1034, and 1036. This combination is selected as the best fit because the total quantity of the resulting lots is the same as the quantity of the lots prior to the split event, and the resulting child lots are at the same current process step as their respective parent lots.

FIGS. 11A-11B illustrate the sequence of transactions 1112, 1114, 1116, 1118, 1140, 1142, 1144, 1146, 1148, 1150, and 1152 created by the Event Interpreter 216 in FIG. 3 by processing the supply chain events 1002, 1006, 1010, 1016, 1020, 1026, and 1032 in FIG. 10. The vertical dotted lines with labels 900 to 950 and the lot status blocks follow the same nomenclature as in FIG. 10. The lot statuses 1120, 1122, 1128, and 1130 represent the transient lot statuses created by the Event Interpreter 216 in FIG. 3 when an event results in a series of dependent transactions.

The Event Interpreter 216 converts the first four events in FIG. 10 on a one-to-one basis to corresponding transactions: specifically, Lot Start 1002 event into the START 1112 transaction, Lot Update 1006 event into the MOVE 1114 transaction, Lot Split 1010 event into the SPLIT 1116 transaction and Lot Merge 1016 event into the MERGE 1118 transaction. The resulting lot statuses in FIG. 1A are the same as those in FIG. 10.

The Lot Split 1020 event in FIG. 10 is converted into the following series of dependent transactions by the Event Interpreter 216 in FIG. 3: a SCRAP 1140 transaction in FIG. 11B, resulting in transient lot status 1120; a MOVE 1142 transaction, resulting in transient lot status 1122; and a SPLIT 1144 transaction, resulting in lot statuses 1022 and 1024. In the example above, the following rules for a Split Event would have been extracted, in the order given, from the Interpretation Rules Database 218 to create the series of dependent transactions: "If Quantity Loss, Perform a SCRAP"; "If Previous Logical Operation of Parent Lot Differs from New Logical Operation of Resulting Lots, Perform MOVE for Parent Lot".

The Lot Split 1026 event in FIG. 10 is converted into the following series of dependent transactions by the Event Interpreter 216 in FIG. 3: a MOVE 1146 transaction in FIG. 11B, resulting in transient lot status 1128; and a SPLIT 1150 transaction, resulting in lot statuses 1028 and 1030. Similarly, the Lot Split 1032 event in FIG. 10 is converted into the following series of dependent transactions by the Event Interpreter 216 in FIG. 3: a MOVE 1148 transaction in FIG. 11B, resulting in transient lot status 1130; and a SPLIT 1152 transaction, resulting in lot statuses 1034 and 1036.

The semiconductor supply chain event identification method in this example is based on combinatorial algorithms and supplier process mapping. It is possible that the selected best-fit strategy may yield multiple valid combinations of split and merge events for a given WIP status update. For example, if the lots shown in FIG. 9E were to each split into two lots with the exact same quantities at the exact same steps as shown in FIG. 9G, the results will be ambiguous. Lot T041305.4 might have been split from either T041305.1 or T041305.3. Similarly, lot T041305.5 might have been split from either T041305.1 or T041305.3. Similar cases of ambiguity also exist for lot merge events.

An additional feature of the present invention provides a solution to resolve such ambiguities. In one approach, the system automatically chooses one of the valid combinations. Alternately, the system sends a notification to an appropriate person to resolve the ambiguity using the Graphical User Interface 224 in FIG. 3.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims. In addition, the use of capitalized terms (e.g., "Supply Chain Event" above) and the lack of capitalized terms (e.g., "supply chain event" in the claims) is not meant to imply a difference in meaning.

What is claimed is:

1. A computer-implemented method for automatically identifying transactions from WIP status updates, the method comprising the steps of:
   a computer-implemented adapter receiving WIP status updates for a semiconductor product from at least one supplier in a supply chain for the semiconductor product;
   converting the WIP status updates to a generalized form expressed in lots, each lot containing a quantity of the semiconductor product, the generalized form identifying a processing status of the lot(s) according to a predefined set of logical operations that describe the supply chain, said logical operations having a coarser granularity than the WIP status updates received from at least one supplier;
   a computer-implemented transaction identifier identifying transactions based on a comparison on a lot basis of the WIP status updates in the generalized form with a previous WIP status for the semiconductor product, the computer-implemented transaction identifier making the comparison by accessing a database containing a set of rules governing an identification of transactions and applying the rules to the WIP status updates in the generalized form and the previous WIP status; and
   a computer-implemented transaction processor processing the transactions to update a transactional enterprise system.

2. The computer-implemented method of claim 1 wherein the transactions are selected from a predefined group that includes: a start transaction, a move transaction, a merge transaction, a split transaction, a scrap transaction, a bonus transaction, and an update transaction.

3. The computer-implemented method of claim 1 wherein the step of receiving WIP status updates comprises:
   the computer-implemented adapter receiving the WIP status updates from at least two different suppliers.

4. A computer-implemented method for automatically identifying transactions from WIP status updates, the method comprising the steps of:
   a computer-implemented adapter receiving WIP status updates for a semiconductor product from at least one supplier in a supply chain for the semiconductor product;
   converting the WIP status updates to a generalized form; and
   a computer-implemented transaction identifier identifying transactions based on a comparison of the WIP status updates in the generalized form with a previous WIP status for the semiconductor product.

5. The computer-implemented method of claim 4 wherein the step of receiving WIP status updates comprises:
   the computer-implemented adapter receiving the WIP status updates from a single supplier.

6. The computer-implemented method of claim 4 wherein the step of receiving WIP status updates comprises:
   the computer-implemented adapter receiving the WIP status updates from at least two different suppliers.

7. The computer-implemented method of claim 4 wherein the step of converting the WIP status updates to a generalized form comprises:
   automatically converting all WIP status updates to the generalized form.

8. The computer-implemented method of claim 4 further comprising:
   a second computer-implemented adapter receiving WIP transactional updates for the semiconductor product from at least one supplier in the supply chain for the semiconductor product; and converting the WIP transactional updates to the generalized form.

9. The computer-implemented method of claim 4 wherein the generalized form identifies a processing status of the semiconductor product according to a predefined set of logical operations that describe the supply chain.

10. The computer-implemented method of claim 9 wherein, for at least one supplier, the WIP status updates received from that supplier identify a processing status of the semiconductor product according to processing steps, and the processing steps have a finer granularity than the logical operations in the predefined set.

11. The computer-implemented method of claim 4 wherein the step of identifying transactions based on a comparison comprises:

the computer-implemented transaction identifier identifying supply chain events based on a comparison of the WIP status updates with the previous WIP status for the semiconductor product; and the computer-implemented transaction identifier interpreting the supply chain events as transactions.

12. The computer-implemented method of claim 11 wherein the step of interpreting the supply chain events as transactions comprises:

the computer-implemented transaction identifier creating transient WIP status if a supply chain event is interpreted as at least two transactions.

13. The computer-implemented method of claim 4 wherein:

the WIP status updates are expressed in lots, each lot containing a quantity of the semiconductor product; and the step of identifying transactions occurs on a lot basis.

14. The computer-implemented method of claim 13 wherein the transactions are selected from a predefined group that includes: a start transaction, a move transaction, a merge transaction, a split transaction, a scrap transaction, a bonus transaction, and an update transaction.

15. The computer-implemented method of claim 13 wherein the step of identifying transactions comprises:

the computer-implemented transaction identifier identifying transactions based on a change in the quantity of semiconductor product in a lot.

16. The computer-implemented method of claim 13 wherein the step of identifying transactions comprises:

the computer-implemented transaction identifier grouping lots from the WIP status update with lots from the previous WIP status; and the computer-implemented transaction identifier identifying transactions within the groupings.

17. The computer-implemented method of claim 16 wherein the step of grouping lots is based on a customer product ID.

18. The computer-implemented method of claim 16 wherein the step of grouping lots is based on a main lot ID.

19. The computer-implemented method of claim 16 wherein the step of grouping lots is based on a customer lot ID.

20. The computer-implemented method of claim 16 wherein the step of identifying transactions within the groupings comprises:

the computer-implemented transaction identifier classifying lots according to a change in the quantity of the lot from the previous WIP status to the WIP status update; and the computer-implemented transaction identifier identifying transactions by combining lots according to their classifications.

21. The computer-implemented method of claim 4 wherein the step of identifying transactions comprises:

the computer-implemented transaction identifier accessing a database containing a set of rules governing an identification of transactions; and the computer-implemented transaction identifier applying the rules to the WIP status updates and the previous WIP status.

22. The computer-implemented method of claim 4 wherein the step of identifying transactions comprises:

the computer-implemented transaction identifier defining a priority among transactions; and the computer-implemented transaction identifier generating a notification if at least two possible transactions of equal priority can be identified from the same WIP status update(s).

23. The computer-implemented method of claim 4 further comprising:

a WIP tracking database updating the previous WIP status for the semiconductor product based on the transactions.

24. The computer-implemented method of claim 23 further comprising:

a user interface making reports of the updated WIP status available to a customer.

25. The computer-implemented method of claim 23 wherein the step of receiving WIP status updates for a semiconductor product from at least one supplier comprises:

the computer-implemented adapter intercepting at least one WIP status update transmitted by one of the suppliers to a customer before the WIP status update reaches the customer.

26. The computer-implemented method of claim 4 further comprising:

a computer-implemented transaction processor processing the transactions to update a transactional enterprise system.

27. The computer-implemented method of claim 26 wherein the transactional enterprise system is an MES, an ERP, or a SCM system.

28. The computer-implemented method of claim 26 further comprising:

a computer-implemented synchronizer updating the previous WIP status for the semiconductor product based on the updated transactional enterprise system.

* * * * *